US010120304B2

(12) United States Patent
Fujita et al.

(10) Patent No.: US 10,120,304 B2
(45) Date of Patent: Nov. 6, 2018

(54) BELT DEVICE INCLUDING SUPPORT PORTIONS AND AN ADJUSTER TO ADJUST POSITIONS OF THE SUPPORT PORTIONS

(71) Applicants: Junpei Fujita, Kanagawa (JP); Naohiro Kumagai, Kanagawa (JP); Seiichi Kogure, Kanagawa (JP); Kazuki Yogosawa, Kanagawa (JP); Kenji Sugiura, Kanagawa (JP); Yuuji Wada, Kanagawa (JP)

(72) Inventors: Junpei Fujita, Kanagawa (JP); Naohiro Kumagai, Kanagawa (JP); Seiichi Kogure, Kanagawa (JP); Kazuki Yogosawa, Kanagawa (JP); Kenji Sugiura, Kanagawa (JP); Yuuji Wada, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/673,492

(22) Filed: Aug. 10, 2017

(65) Prior Publication Data

US 2018/0046115 A1 Feb. 15, 2018

(30) Foreign Application Priority Data

Aug. 12, 2016 (JP) ................................ 2016-158964
Dec. 9, 2016 (JP) ................................ 2016-239750
Jun. 9, 2017 (JP) ................................ 2017-114581

(51) Int. Cl.
*G03G 15/16* (2006.01)

(52) U.S. Cl.
CPC ..... *G03G 15/1615* (2013.01); *G03G 15/1685* (2013.01); *H05K 999/99* (2013.01)

(58) Field of Classification Search
CPC ......................... G03G 15/1615; G03G 21/168
USPC .................................................. 399/121, 126
See application file for complete search history.

(56) References Cited

U.S. PATENT DOCUMENTS

| | | | | |
|---|---|---|---|---|
| 7,664,429 | B2 * | 2/2010 | Murai et al. | G03G 15/167 399/121 |
| 9,042,779 | B2 * | 5/2015 | Kogure et al. | G03G 15/1615 399/121 |
| 2009/0180805 | A1 | 7/2009 | Nakura et al. | |
| 2010/0142985 | A1 | 6/2010 | Minbe et al. | |
| 2010/0221029 | A1 | 9/2010 | Minbu et al. | |
| 2011/0206399 | A1 | 8/2011 | Fujita et al. | |
| 2011/0293312 | A1 | 12/2011 | Mimbu et al. | |
| 2014/0241744 | A1 | 8/2014 | Ichikawa et al. | |
| 2014/0353126 | A1 | 12/2014 | Sengoku | |

(Continued)

FOREIGN PATENT DOCUMENTS

JP 2016-004122 1/2016

OTHER PUBLICATIONS

U.S. Appl. No. 15/596,365, filed May 16, 2017.
U.S. Appl. No. 15/427,735, filed Feb. 8, 2017.

*Primary Examiner* — William J Royer
(74) *Attorney, Agent, or Firm* — Oblon, McClelland, Maier & Neustadt, L.L.P.

(57) ABSTRACT

A belt device includes a belt unit including a plurality of rotators and a belt looped around the plurality of rotators. The belt device further includes a frame including a plurality of support portions to support the belt unit, a biasing member to bias the belt unit supported by the frame in a predetermined direction, and an adjuster to adjust a position of at least one of the plurality of support portions.

20 Claims, 24 Drawing Sheets

(56) References Cited

U.S. PATENT DOCUMENTS

| | | | |
|---|---|---|---|
| 2015/0212454 A1 | 7/2015 | Ichikawa et al. | |
| 2016/0033915 A1 | 2/2016 | Kumagai et al. | |
| 2016/0041508 A1 | 2/2016 | Kogure et al. | |

* cited by examiner

BELT DEVICE INCLUDING SUPPORT PORTIONS AND AN ADJUSTER TO ADJUST POSITIONS OF THE SUPPORT PORTIONS

CROSS-REFERENCE TO RELATED APPLICATIONS

This patent application is based on and claims priority pursuant to 35 U.S.C. § 119(a) to Japanese Patent Application Nos. 2016-158964 filed on Aug. 12, 2016, 2016-239750 filed on Dec. 9, 2016, and 2017-114581 filed on Jun. 9, 2017, in the Japan Patent Office, the entire disclosure of each of which is hereby incorporated by reference herein.

BACKGROUND

Technical Field

This disclosure generally relates to a belt device and an image forming apparatus incorporating the belt device.

Description of the Related Art

There are belt devices including a plurality of rotators, an endless belt rotatably looped around the plurality of rotators, and a pressing device to press the belt against a pressed target.

SUMMARY

According to an embodiment of this disclosure, a belt device includes a belt unit including a plurality of rotators and a belt looped around the plurality of rotators. The belt device further includes a frame including a plurality of support portions to support the belt unit, a biasing member to bias the belt unit supported by the frame in a predetermined direction, and an adjuster to adjust a position of at least one of the plurality of support portions.

In another embodiment, an image forming apparatus includes an image bearer to bear a toner image and the belt device described above. The belt is a transfer belt pressed against the image bearer, and the toner image is transferred from the image bearer onto the belt in a transfer nip between the image bearer and the belt.

In yet another embodiment, a belt device includes a belt unit including a plurality of rotators and a belt looped around the plurality of rotators. The belt device further includes a frame including a plurality of support portions to support the belt unit, a biasing member to bias the belt unit supported by the frame in a predetermined direction, and an adjuster to adjust a twist of the belt unit relative to the frame.

In yet another embodiment, an image forming apparatus includes an image bearer to bear a toner image and the belt device described above. The belt is a transfer belt pressed against the image bearer, and the toner image is transferred from the image bearer onto the belt in a transfer nip between the image bearer and the belt.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
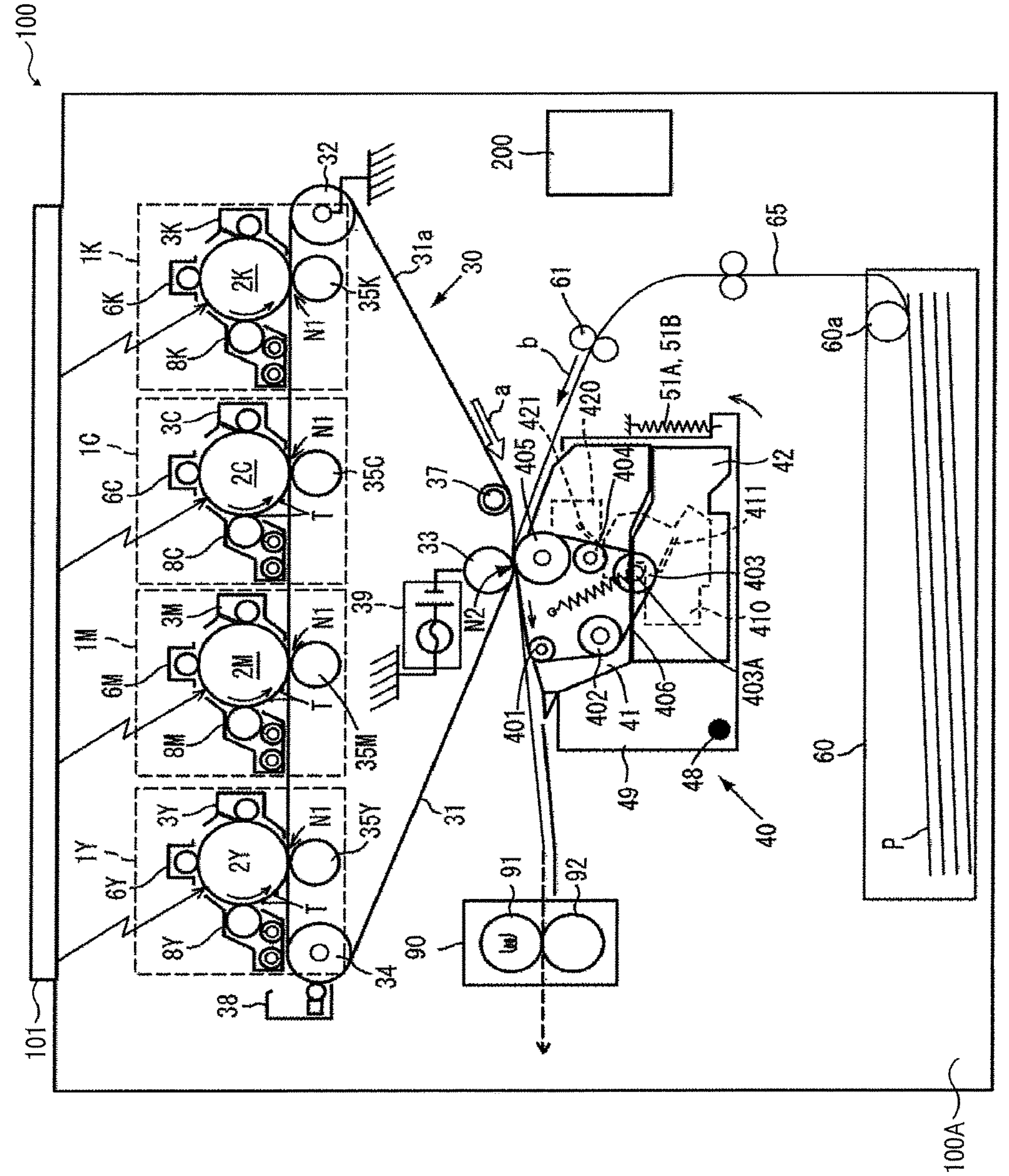
FIG. 1 is a schematic view of an image forming apparatus including a transfer device as a belt device, according to an embodiment.

The accompanying drawings are intended to depict embodiments of the present invention and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views thereof, and particularly to FIG. 1, an image forming apparatus according to an embodiment of this disclosure is described. As used herein, the singular forms “a”, “an”, and “the” are intended to include the plural forms as well, unless the context clearly indicates otherwise.

The suffixes Y, M, C, and K attached to each reference numeral indicate only that components indicated thereby are used for forming yellow, magenta, cyan, and black images, respectively, and hereinafter may be omitted when color discrimination is not necessary.

FIG. 1 illustrates an image forming apparatus 100, which is, for example, an electrophotographic color printer. The image forming apparatus 100 includes four image forming units 1 (1Y, 1M, 1C, and 1K) for forming yellow (Y), magenta (M), cyan (C), and black (K) toner images, an intermediate transfer unit 30 (an intermediate transfer device), a transfer device 40 (a belt device), a sheet tray 60 to contain recording sheets P, and a fixing device 90. The transfer device 40 includes a secondary transfer unit 41 (a belt unit).

The four image forming units 1Y, 1M, 1C, and 1K are similar in configuration except the color of toner (powdered developer) employed. The image forming units 1Y, 1M, 1C, and 1K are replaced when the respective product live expire. The four image forming units 1Y, 1M, 1C, and 1K are removably mounted in a body of the image forming apparatus (an apparatus body 100A) and replaceable.

The image forming unit 1 includes, a drum-shaped photoconductor 2 (2Y, 2M, 2C, or 2K) as an image bearer, a photoconductor cleaner 3 (3Y, 3M, 3C, or 3K, a discharger, a charging device 6 (6Y, 6M, 6C, or 6K), and a developing device 8 (8Y, 8M, 8C, or 8K). The components of the image forming unit 1 are held in a common casing and construct a process cartridge mountable and removable in and from the apparatus body 100A. That is, the components of the image forming unit 1 are replaceable at a time.

Driven by a driver such as a motor, the photoconductor 2 rotates counterclockwise in FIG. 1. The charging device 6 includes a charging roller to which a charging bias is applied. While the charging roller is in contact with or close to the photoconductor 2, the charging device 6 causes an electrical discharge therebetween, thereby uniformly charging the surface of the photoconductor 2. Alternatively, instead of using the charging roller disposed in contact with or close to the photoconductor 2, a corona charger or the like that does not contact the photoconductor 2 may be employed.

The surface of the photoconductor 2, uniformly charged by the charging device 6, is scanned by exposure light such as a laser beam from an optical writing unit 101 disposed above the image forming units 1. Thus, an electrostatic latent image of yellow, magenta, cyan, or black is formed on the surface of the photoconductor 2. The developing device 8 develops the electrostatic latent image on the photoconductor 2 with yellow, magenta, cyan, or black toner, into a visible toner image T. The toner image T is primarily transferred from the photoconductor 2 onto a front face 31*a* of an intermediate transfer belt 31, which is an endless belt.

The photoconductor cleaner 3 removes residual toner (untransferred toner) remaining on the surface of the photoconductor 2 after a primary transfer process, that is the surface downstream from a primary transfer nip (between the intermediate transfer belt 31 and the photoconductor 2) in the direction of rotation of the photoconductor 2. The discharger removes residual charge remaining on the photoconductor 2 after the surface thereof is cleaned by the photoconductor cleaner 3. Thus, the surface of the photoconductor 2 is initialized in preparation for subsequent image formation.

Below the image forming units 1Y, 1M, 1C, and 1K, the intermediate transfer unit 30, serving as a belt unit and a primary transfer device, is disposed. The intermediate transfer unit 30 rotates the intermediate transfer belt 31 clockwise in FIG. 1. The direction of rotation of the intermediate transfer belt 31, indicated by arrow a in FIG. 1, is referred to as a belt travel direction a.

The intermediate transfer unit 30 is removably mountable (replaceable) in the apparatus body 100A. In addition to the intermediate transfer belt 31 (an image bearer or intermediate transferor), the intermediate transfer unit 30 includes a drive roller 32, a secondary-transfer backup roller 33, a cleaning backup roller 34, four primary transfer rollers 35Y, 35M, 35C, and 35K (which may be referred to collectively as primary transfer rollers 35), and a pre-transfer roller 37.

The intermediate transfer belt 31 is looped and stretched taut around a plurality of rollers disposed inside the loop, namely, the drive roller 32, the secondary-transfer backup roller 33, the cleaning backup roller 34, the four primary transfer rollers 35Y, 35M, 35C, and 35K, and the pre-transfer roller 37. As the drive roller 32 rotates clockwise in FIG. 1, driven by a driver such as motor, the intermediate transfer belt 31 rotates endlessly in the same direction. In the present embodiment, the intermediate transfer belt 31 is an endless elastic belt including a plurality of layers. The intermediate transfer belt 31 serves as an intermediate transferor onto which the toner images are transferred from the photoconductors 2Y, 2M, 2C, and 2K.

The intermediate transfer belt 31 is nipped between the primary transfer rollers 35Y, 35M, 35C, and 35K, and photoconductors 2Y, 2M, 2C, and 2K. The portions where the front face 31*a* (on which toner images are borne) of the intermediate transfer belt 31 contacts the surfaces of the photoconductors 2Y, 2M, 2C, and 2K are referred to as “primary transfer nips N1” (transfer positions). A primary transfer bias is applied to the primary transfer rollers 35Y, 35M, 35C, and 35K by a transfer bias power source. Accordingly, transfer electric fields are generated between the primary transfer rollers 35Y, 35M, 35C, and 35K, and the toner images on the photoconductors 2Y, 2M, 2C, and 2K, respectively.

For example, the yellow toner image on the surface of the photoconductor 2Y enters the primary transfer nip N1 for yellow as the photoconductor 2Y rotates. Subsequently, the yellow toner image is primarily transferred from the photoconductor 2Y onto the intermediate transfer belt 31 with effects of the transfer electric field and nip pressure. While the intermediate transfer belt 31 carrying the yellow toner image passes through the primary transfer nips N1 of magenta, cyan, and black sequentially, magenta, cyan, and black toner images are transferred from the photoconductors 2M, 2C, and 2K and superimposed, one atop the other, on the yellow toner image on the intermediate transfer belt 31. Thus, a four-color superimposed toner image is formed on the surface of the intermediate transfer belt 31.

Although the description above concerns full-color image formation, alternatively, the image forming apparatus 100 can form a single-color toner image using one of yellow, magenta, cyan, and black toners, and a superimposed toner image using at least two of these toners and transfer such an image onto the intermediate transfer belt 31.

Outside and below the loop of the intermediate transfer belt 31, the transfer device 40 including the secondary transfer unit 41 is disposed. The secondary transfer unit 41 includes a secondary transfer belt 406 as a transfer rotator. The secondary transfer belt 406 is harder than the intermediate transfer belt 31 and is made of, for example, polyimide (PI) resin. The secondary transfer unit 41 is attached to a pressing frame 49 to press the secondary transfer unit 41. The pressing frame 49 is swingably attached to a base of the apparatus body 100A with a support shaft 48 attached to a lower end of the pressing frame 49. To an end (on the right in FIG. 1) of the pressing frame 49 opposite the support shaft 48, first ends of coil springs 51A and 51B are attached. The coil springs 51A and 51B bias the pressing frame 49 in a predetermined direction (upward in FIG. 1), as indicated by an arrow in FIG. 1. The coil springs 51A and 51B serve as biasing members to bias the secondary transfer unit 41 being the belt unit. Examples of the biasing member include, in addition to a spring to exert resilience, a sponge to exert elasticity and a solenoid to exert an electromagnetic force. Second ends of the coil springs 51A and 51B are attached to the apparatus body 100A. Accordingly, the secondary transfer unit 41 attached to the pressing frame 49 is pressed against the intermediate transfer belt 31 (a pressed target), and the secondary transfer belt 406 is pressed to the intermediate transfer belt 31.

The secondary transfer unit 41 nips the intermediate transfer belt 31 between the secondary-transfer backup roller 33 disposed inside the loop of the intermediate transfer belt 31 and the secondary transfer belt 406. The contact portion between the front face 31*a* of the intermediate transfer belt 31 and the secondary transfer belt 406 is referred to as a secondary transfer nip N2. In the present embodiment, a power source 39 as a transfer bias power source applies a secondary transfer bias to the secondary-transfer backup roller 33. Accordingly, a secondary transfer electrical field is generated between the secondary-transfer backup roller 33 and the secondary transfer belt 406. The secondary transfer electric field electrostatically moves the toner, which has a negative polarity, from the secondary-transfer backup roller 33 toward the secondary transfer belt 406.

In the present embodiment, the toner image is transferred secondarily from the intermediate transfer belt 31 onto the recording sheet P in the secondary transfer nip N2. The intermediate transfer belt 31 is an image bearer that forms the secondary transfer nip N2 together with the secondary transfer belt 406 that is a conveyor belt. The intermediate transfer belt 31 also serves as an intermediate transferor onto which the toner images are transferred primarily from the photoconductors 2Y, 2M, 2C, and 2K. Onto the secondary transfer belt 406, a test toner image used for image density detection is transferred.

Although, in the description above, the power source 39 applies the secondary transfer bias to the secondary-transfer backup roller 33, alternatively, the power source 39 may apply the secondary transfer bias to a secondary transfer roller 405 disposed opposite the secondary-transfer backup roller 33. When the secondary transfer bias is applied to the secondary transfer roller 405, the secondary transfer bias applied is opposite in polarity to the toner. When the secondary transfer bias is applied to the secondary-transfer backup roller 33, the secondary transfer bias applied is identical in polarity to the toner. The secondary transfer roller 405 is also referred to as a nip forming roller.

Below the transfer device 40 in FIG. 1, the sheet tray 60 to store a bundle of recording sheets P is disposed. Various types of sheets and resin sheets are usable as the recording sheets P. The sheet tray 60 is provided with a feed roller 60*a* to contact the top sheet of recording sheet P in the sheet tray 60. As the feed roller 60*a* is rotated at a predetermined timing, the feed roller 60*a* picks up and sends the top sheet of the recording sheets P to a conveyance path 65 leading from the sheet tray 60 to the secondary transfer nip N2. Then, a registration roller pair 61 forwards the recording sheet P in the conveyance path 65 to the secondary transfer nip N2, so that the recording sheet P coincides with the toner image on the front face 31*a* of the intermediate transfer belt 31 in the secondary transfer nip N2. The recording sheet P is a conveyed object.

In the secondary transfer nip N2, the superimposed toner image on the front face 31*a* of the intermediate transfer belt 31 secondarily is transferred onto the recording sheet P with effects of the secondary transfer electric field and the nip pressure, and the toner image becomes a full-color toner image on the white recording sheet P. After the intermediate transfer belt 31 passes through the secondary transfer nip N2, residual toner not transferred onto the recording sheet P remains on the intermediate transfer belt 31. The residual toner is removed from the intermediate transfer belt 31 by a belt cleaner 38 disposed in contact with the front face 31*a* of the intermediate transfer belt 31.

The fixing device 90 is disposed downstream from the secondary transfer nip N2 in the direction indicated by arrow b, which is hereinafter referred to as sheet conveyance direction b. After the secondary transfer, the recording sheet P, onto which the toner image is transferred, is transported to the fixing device 90. The fixing device 90 includes a fixing roller 91 including a heat source inside thereof and a pressure roller 92. The fixing roller 91 and the pressure roller 92 contact to form a fixing nip where heat and pressure are applied. The full-color toner image is softened and fixed on the recording sheet P as the recording sheet P passes through the fixing nip. Then, the recording sheet P is output from the fixing device 90, outside the image forming apparatus 100.

Descriptions are given below of the transfer device 40 in further detail.

Figure 2:
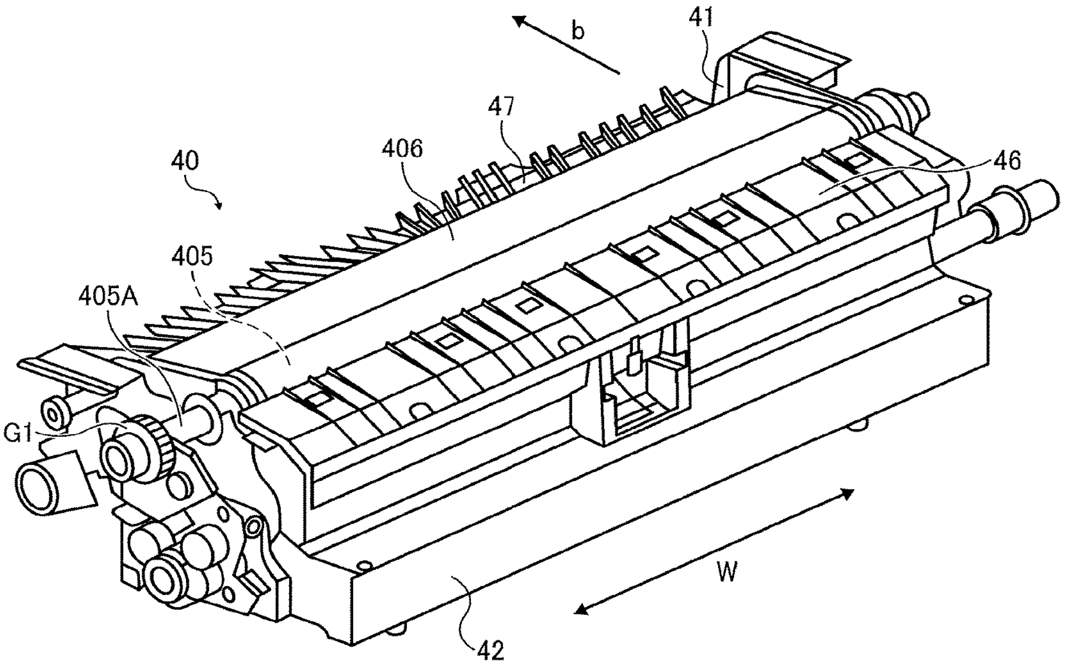
FIG. 2 is a perspective view illustrating an exterior of the transfer device illustrated in FIG. 1.
Figure 3:
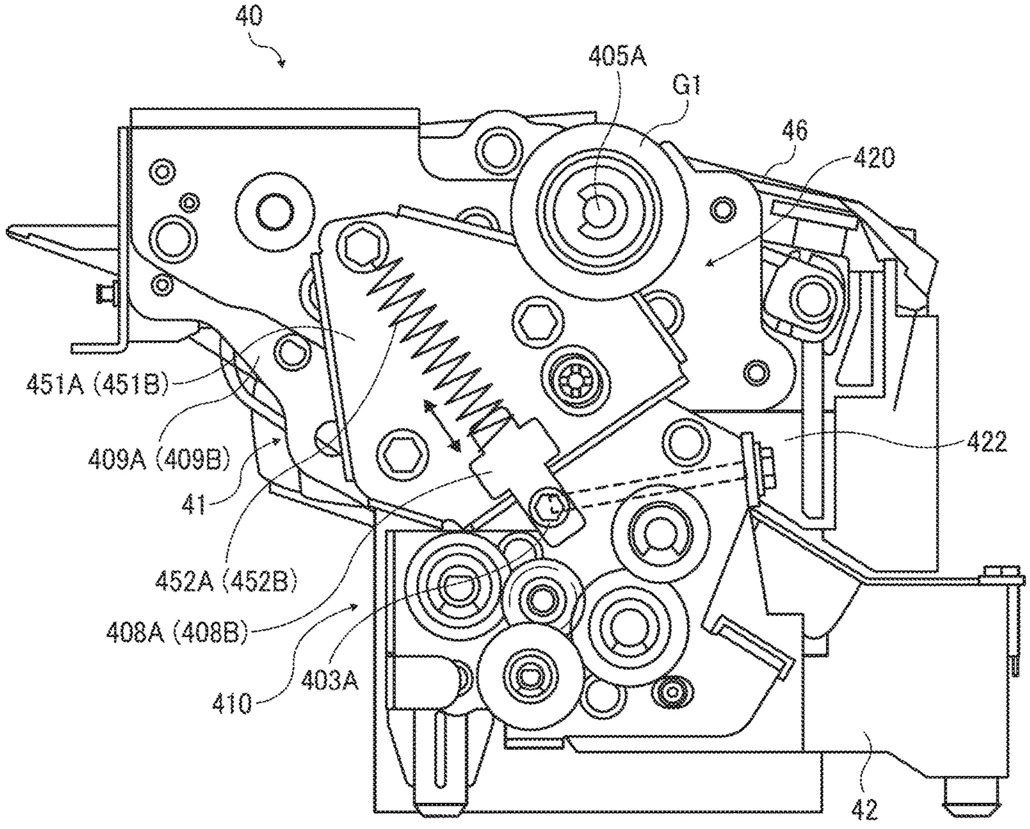
FIG. 3 is an external view of the transfer device illustrated in FIG. 2, as viewed in an axial direction of a rotator of a transfer device according to an embodiment.
Figure 4:
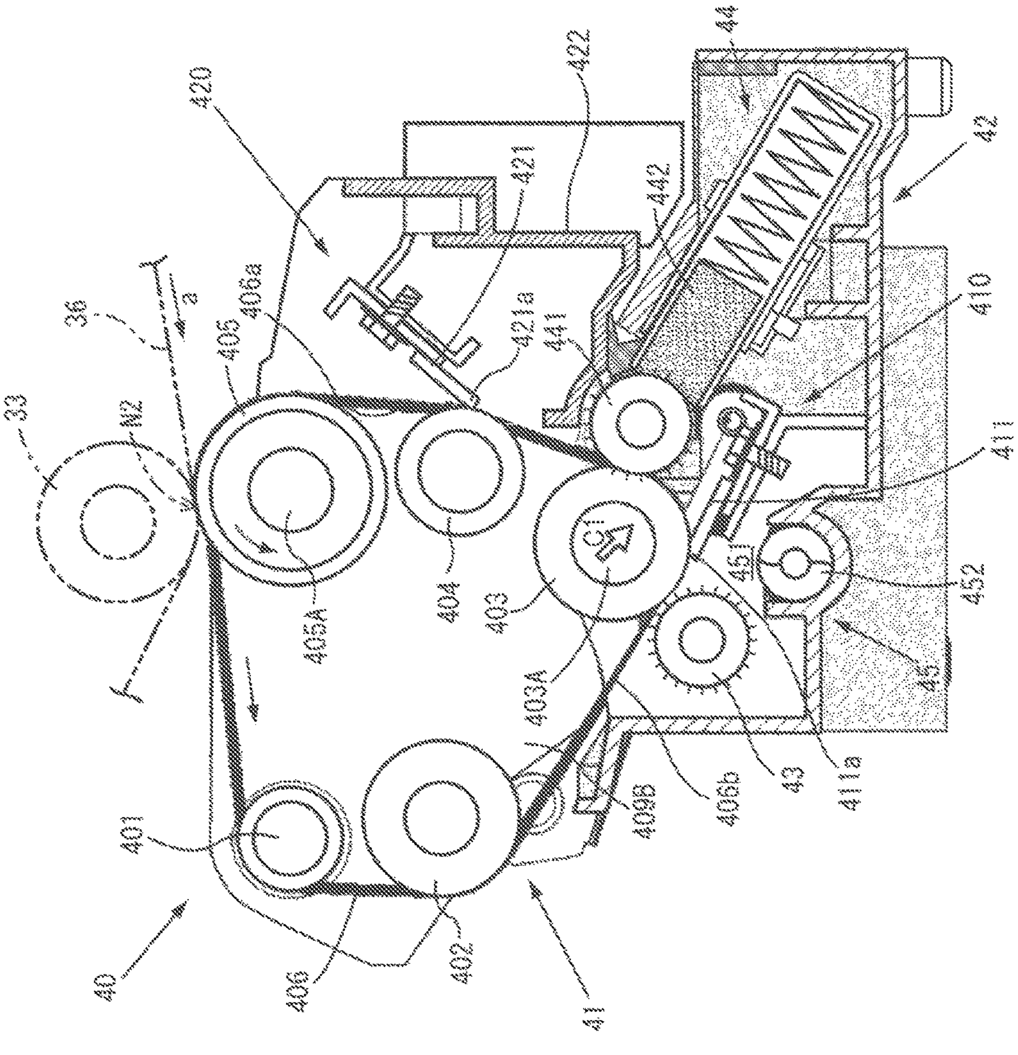
FIG. 4 is a cross-sectional view of a main part of the transfer device illustrated in FIG. 2.

FIG. 2 is a perspective view illustrating an exterior of the transfer device 40. FIG. 3 is an external view of the transfer device 40 as viewed in the direction of axis around which the secondary transfer belt 406 rotates (i.e., an axial direction). FIG. 4 is a cross-sectional view of a main part of the transfer device 40. In FIG. 2, arrow W indicates a longitudinal direction (the axial direction) of the transfer device 40. The transfer device 40 includes the secondary transfer unit 41 and a plurality of cleaning units, namely, a first cleaning unit 410, a second cleaning unit 420, and a cleaning device 42. In the transfer device 40, the secondary transfer unit 41 and the first cleaning unit 410 are united together, and the second cleaning unit 420 and the cleaning device 42 are united together.

The first cleaning unit 410 is disposed upstream from the second cleaning unit 420 in the direction of rotation of the secondary transfer belt 406. An upstream conveyance guide 46 is disposed on an upper side of the second cleaning unit 420 and upstream from the secondary transfer belt 406 (the secondary transfer nip N2) in the sheet conveyance direction b. The transfer device 40 further includes a downstream conveyance guide 47 disposed downstream from the secondary transfer belt 406 (the secondary transfer nip N2) in the sheet conveyance direction b.

The secondary transfer unit 41 includes the secondary transfer belt 406 looped around a plurality of rotators as illustrated in FIG. 4. In the present embodiment, the plurality of rotators includes a separation roller 401, a driven roller 402, a tension roller 403 (serving as a first blade-opposing roller as well as a tension applicator), a second blade-opposing roller 404, and the secondary transfer roller 405. The secondary transfer belt 406 is looped around these rollers, and the tension roller 403 gives tension, from inside the loop, to the secondary transfer belt 406. The secondary transfer roller 405 serves as a drive roller. Specifically, as illustrated in FIGS. 2 and 3, a gear G1 is attached to an end of a shaft 405A of the secondary transfer roller 405. As a driving force is transmitted from a driving source to the gear G1, the shaft 405A rotates counterclockwise in the drawing, thereby rotating the secondary transfer belt 406 counterclockwise in the drawing.

As illustrated in FIGS. 3 and 4, a pair of side plates 409A and 409B supports the separation roller 401, the driven roller 402, the second blade-opposing roller 404, and the secondary transfer roller 405 rotatably. The side plates 409A and 409B are disposed at both ends in the axial direction of these rollers. The side plates 409A and 409B support, via bearings, the separation roller 401, the driven roller 402, the second blade-opposing roller 404, and the secondary transfer roller 405 to make the axial directions thereof parallel to each other. Thus, the positions of the separation roller 401, the driven roller 402, the second blade-opposing roller 404, and the secondary transfer roller 405 are determined relative to the side plates 409A and 409B. The tension roller 403 includes a shaft 403A. As illustrated in FIG. 3, both ends of the shaft 403A are supported by a pair of holders 408A and 408B. The holders 408A and 408B are slidably supported by pressure plate 451A and 451B secured to the side plates 409A and 409B, respectively. The holders 408A and 408B slide in the direction to move the secondary transfer belt 406 from inside to the outside of the loop of the secondary transfer belt 406. Between the pressure plate 451A and the holder 408A, a pressure spring 452A to give tension to the tension roller 403 is interposed. Between the pressure plate 451B and the holder 408B, a pressure spring 452B to give tension to the tension roller 403 is interposed. First ends of the pressure springs 452A and 452B are secured to the pressure plate 451A and 451B, respectively and second ends thereof are attached to the holders 408A and 408B, respectively. Accordingly, the tension roller 403 presses the secondary transfer belt 406 from inside the loop to the outside. The second blade-opposing roller 404 is disposed between the tension roller 403 and the secondary transfer roller 405. The second blade-opposing roller 404 contacts a back face 406*a* (in FIG. 4) of the secondary transfer belt 406. The tension roller 403 is movable in the direction indicated by arrow c1 in FIG. 4 and the opposite direction.

The secondary transfer unit 41 is movably supported by a unit frame 422 extending in the axial direction and serves as a case of the cleaning device 42. Specifically, the secondary transfer unit 41 is movable in the direction toward the secondary-transfer backup roller 33 and the opposite direction, to change the width or pressure of the secondary transfer nip N2. Further, the secondary transfer unit 41 is movable in such directions to press and disengage the secondary transfer belt 406 to and from the intermediate transfer belt 31.

The first cleaning unit 410 includes a first cleaning blade 411 (i.e., a cleaner). An end 411*a* of the first cleaning blade 411 is disposed opposite the tension roller 403 via the secondary transfer belt 406 and biting into a front face 406*b* of the secondary transfer belt 406. The second cleaning unit 420 includes a second cleaning blade 421 (i.e., a cleaner). An end 421*a* of the second cleaning blade 421 is disposed opposite the second blade-opposing roller 404 via the secondary transfer belt 406 and biting into the front face 406*b* of the secondary transfer belt 406.

The cleaning device 42 includes a dust removal brush 43 to remove dust such as paper dust, a lubricant applicator 44, and a collection section 45. The dust removal brush 43 includes a brush portion overlying a tubular body. The dust removal brush 43 is disposed in contact with the front face 406*b* of the secondary transfer belt 406. In the direction of rotation of the secondary transfer belt 406, the dust removal brush 43 is disposed upstream from the first cleaning unit 410, to remove substances (mainly paper dust) from the front face 406*b* of the secondary transfer belt 406. In one embodiment, the dust removal brush 43 rotates to follow the rotation of the secondary transfer belt 406. Alternatively, the dust removal brush 43 can be disposed to rotate in the direction counter to the rotation of the secondary transfer belt 406.

The lubricant applicator 44 is disposed between the first cleaning unit 410 and the second cleaning unit 420 and includes a lubricating brush 441 to apply lubricant 442 to the front face 406*b* of the secondary transfer belt 406.

The collection section 45 is located below a contact portion where the first cleaning blade 411 contacts the secondary transfer belt 406. The collection section 45 includes a compartment 451 to store the paper dust removed by the dust removal brush 43 and the toner removed by the first cleaning blade 411. Inside the compartment 451, a conveying screw 452 is disposed to convey the substances accumulating in the compartment 451 toward a waste toner tank in the apparatus body 100A.

Thus, the transfer device 40 cleans, with a plurality of cleaners (the first and second cleaning blades 411 and 421), the secondary transfer belt 406 kept taut by the tension roller 403. In such a configuration, the second cleaning blade 421 (i.e., a downstream blade) removes toner that has escaped the first cleaning blade 411 (i.e., an upstream blade), thus improving the performance of cleaning.

Figure 5A:
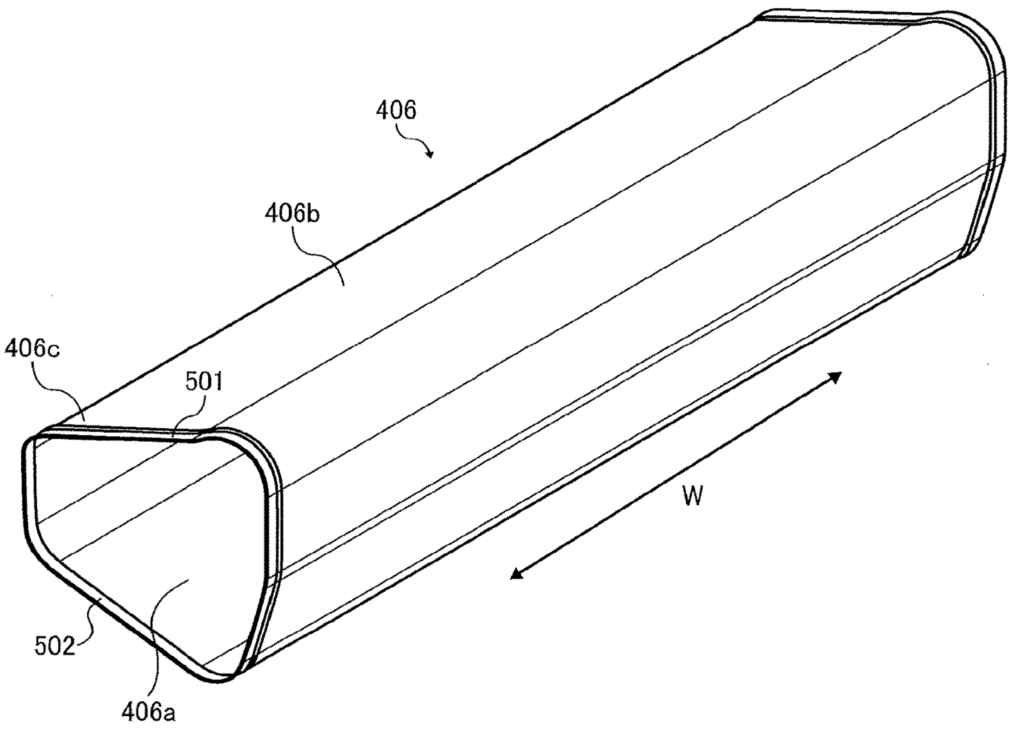
FIG. 5A is a perspective view of a belt according to an embodiment.
Figure 5B:
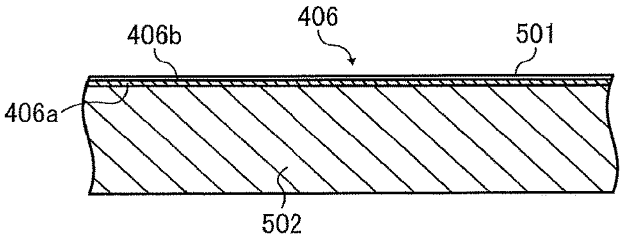
FIG. 5B is a cross-sectional view of the belt illustrated in FIG. 5A.

Referring to FIGS. 5A and 5B, descriptions are given below of the secondary transfer belt 406 according to the present embodiment. On the back face 406*a* of the secondary transfer belt 406 and at an end 406*c* of the secondary transfer belt 406 in the axial direction indicated by arrow W (hereinafter "axial direction W" or also referred to as "belt width direction"), a belt guide 502, serving as a deviation restraint, is disposed. The belt guide 502 inhibits the secondary transfer belt 406 from being drawn to one side in the belt width direction W. The belt guide 502 extends fully along the inner circumference of the secondary transfer belt 406. The end 406*c* of the secondary transfer belt 406 facing the belt wide 502 is reinforced by a reinforcement tape 501, to prevent tearing of the end 406*c*. In one embodiment, the secondary transfer belt 406 is made of polyimide. However, the material is not limited to polyimide but can be, for example, nylon.

Figure 6:
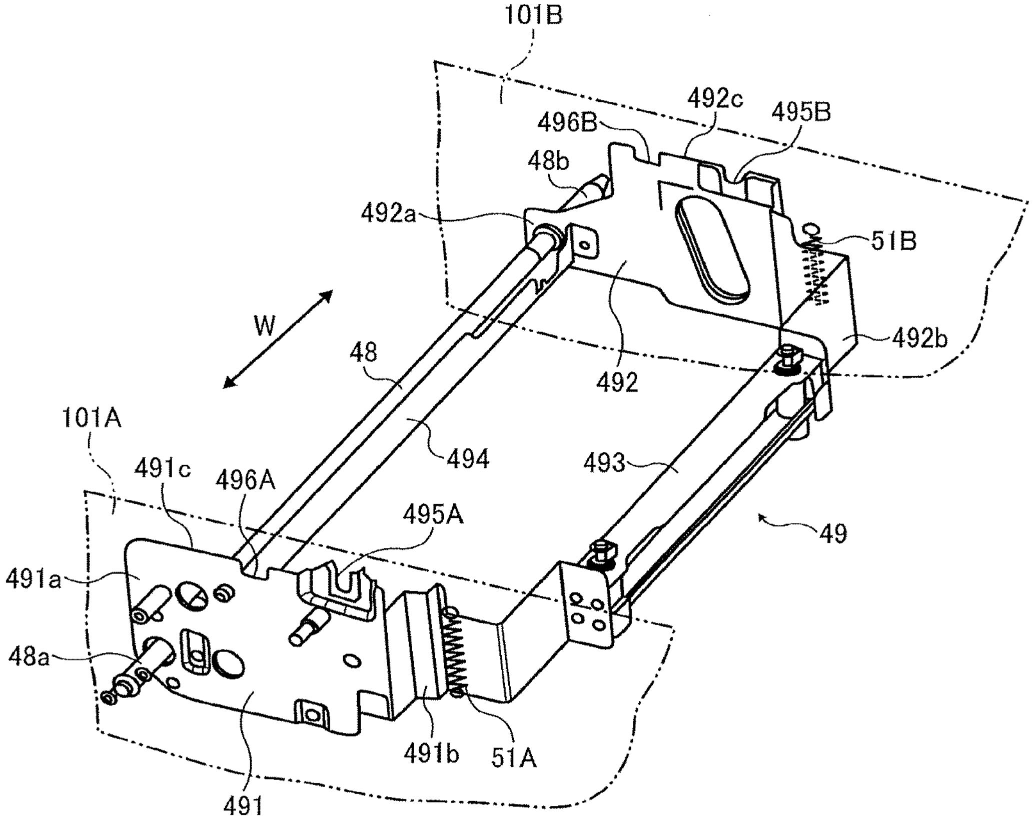
FIG. 6 is a perspective view of a pressing frame to press a belt unit according to an embodiment.

FIG. 6 illustrates the pressing frame 49. The pressing frame 49 is a metal base to support a unit including the secondary transfer unit 41 and the cleaning device 42 mounted therein. The pressing frame 49 includes a front plate 491 and a rear plate 492 (support plates) facing each other in the axial direction W. The front plate 491 is coupled to the rear plate 492 by connections 493 and 494 extending in the axial direction W, into a box shape that is rectangular on a plane. Thus, torsional rigidity is enhanced. The front plate 491 and the rear plate 492 are respectively disposed on the front side and the rear side of the apparatus body 100A. The front plate 491 and the rear plate 492 are disposed outside the side plates 409A and 409B in the axial direction W.

The support shaft 48 extending in the axial direction W penetrates first ends 491*a* and 492*a* (on the left in FIG. 6) of the front plate 491 and the rear plate 492, and thus the relative positions thereof are determined. Ends 48*a* and 48*b* of the support shaft 48 are rotatably supported by bases 101A and 101B in the apparatus body 100A. Thus, the support shaft 48 serves as a fulcrum for rotation of the pressing frame 49. In the present embodiment, the bases 101A and 101B are frame side plates of a retractable unit (a drawer unit) to be retracted into and pulled out from the apparatus body 100A. The retractable unit has a known structure to be pulled out from the apparatus body 100A in removal of a recording sheet P jammed close to the secondary transfer nip N2.

The components to determine the positions of the ends 48*a* and 48*b* of the support shaft 48 are not limited to the bases 101A and 101B (side plates of the retractable unit). For example, a plate serving as a base of the intermediate transfer unit 30 can be used instead.

The first ends of the coil springs 51A and 51B are attached to second ends 491*b* and 492*b* (on the right in FIG. 6) of the front plate 491 and the rear plate 492, respectively. The second ends of the coil springs 51A and 51B are attached, for example, to the bases 101A and 101B, respectively.

An upper face 491*c* of the front plate 491 is provided with a plurality of support portions, namely, positioning portions 495A and 496A. An upper face 492*c* of the rear plate 492 is provided with a plurality of support portions, namely, positioning portions 495B and 496B. The positioning portions 495A and 495B are axisymmetric and disposed opposite from each other. The positioning portions 496A and 496B are axisymmetric and disposed opposite from each other.

Figure 7:
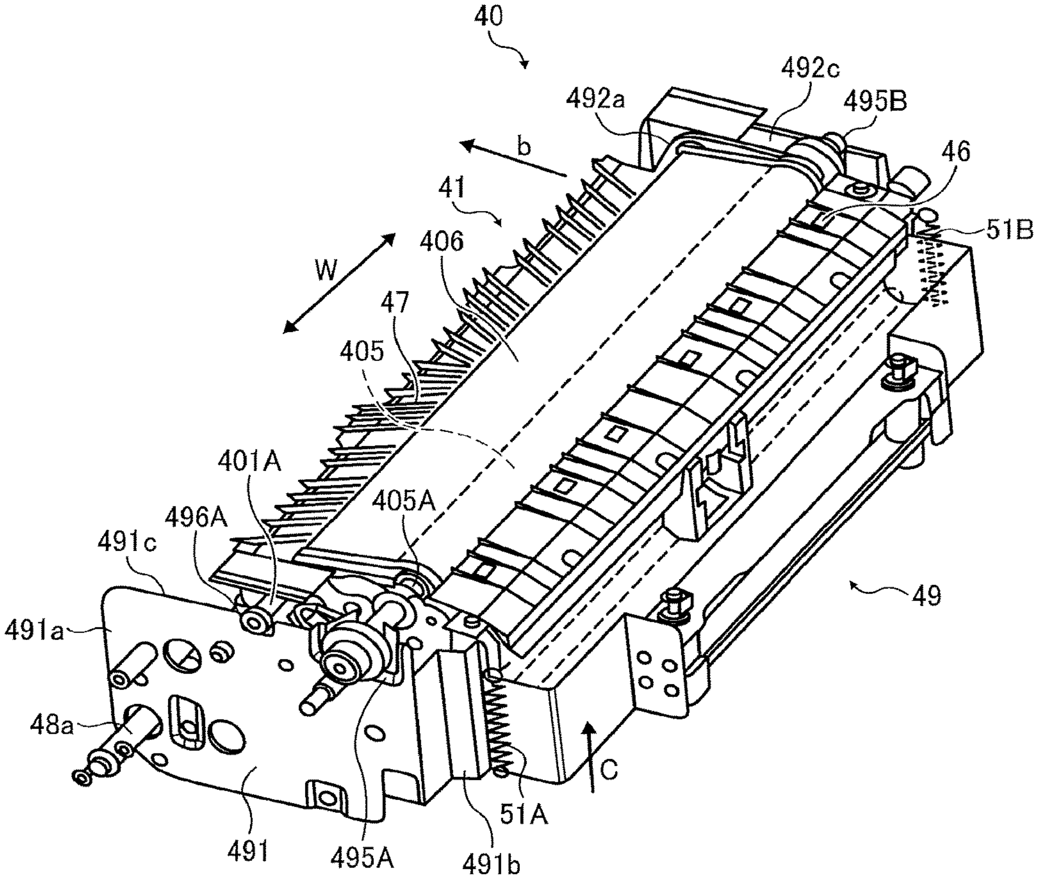
FIG. 7 is a perspective view of the belt unit supported by the pressing frame illustrated in FIG. 6.

As illustrated in FIG. 7, as the secondary transfer unit 41 is mounted in the transfer device 40, the positioning portions 495A and 495B hold the shaft 405A of the secondary transfer roller 405 in position. Additionally, the positioning portions 496A and 496B hold a shaft 401A of the separation roller 401 in position. Thus, the positions of the secondary transfer roller 405 and the separation roller 401 are determined. The separation roller 401 is also referred to as an entrance roller.

Figure 8:
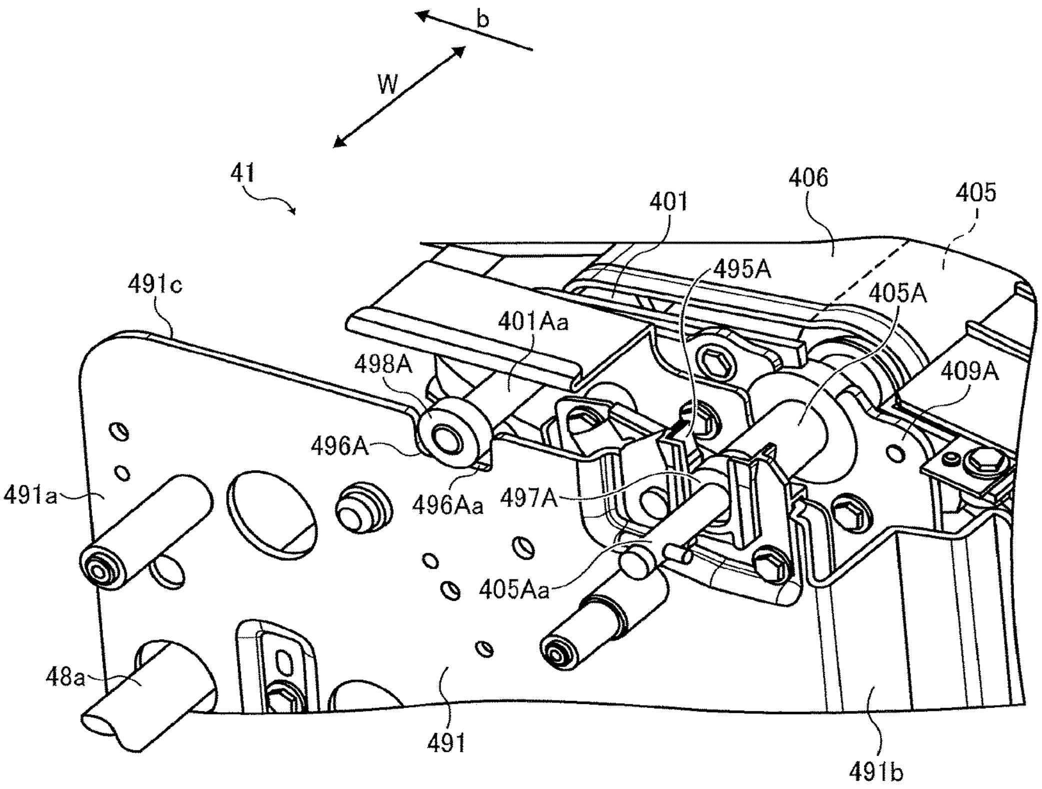
FIG. 8 is a perspective view of a support structure for one end of a shaft of a rotator to support the belt according to an embodiment.

Referring to FIG. 8, an upper side of the positioning portion 495A is open and serves as a pocket. A ball bearing 497A attached to a first end 405Aa of the shaft 405A is put into the pocket from above the upper face 491*c*. The positioning portion 495A has a width almost identical to the diameter of the ball bearing 497A. Thus, when the ball bearing 497A is fitted in the positioning portion 495A, the position of the ball bearing 497A is determined in the axial direction W and the sheet conveyance direction b.

The positioning portion 496A is recessed downward from the upper face 491*c*. A ball bearing 498A is attached to a first end 401Aa of the shaft 401A of the separation roller 401, and the ball bearing 498A is put in the positioning portion 496A from above. The positioning portion 496A has a width greater than the diameter of the ball bearing 498A. Thus, when the ball bearing 498A is put in the positioning portion 496A, the ball bearing 498A is mounted on a bottom 496Aa of the positioning portion 496A and supported movably in the axial direction W, the sheet conveyance direction b, and a vertical direction Z.

Figure 9:
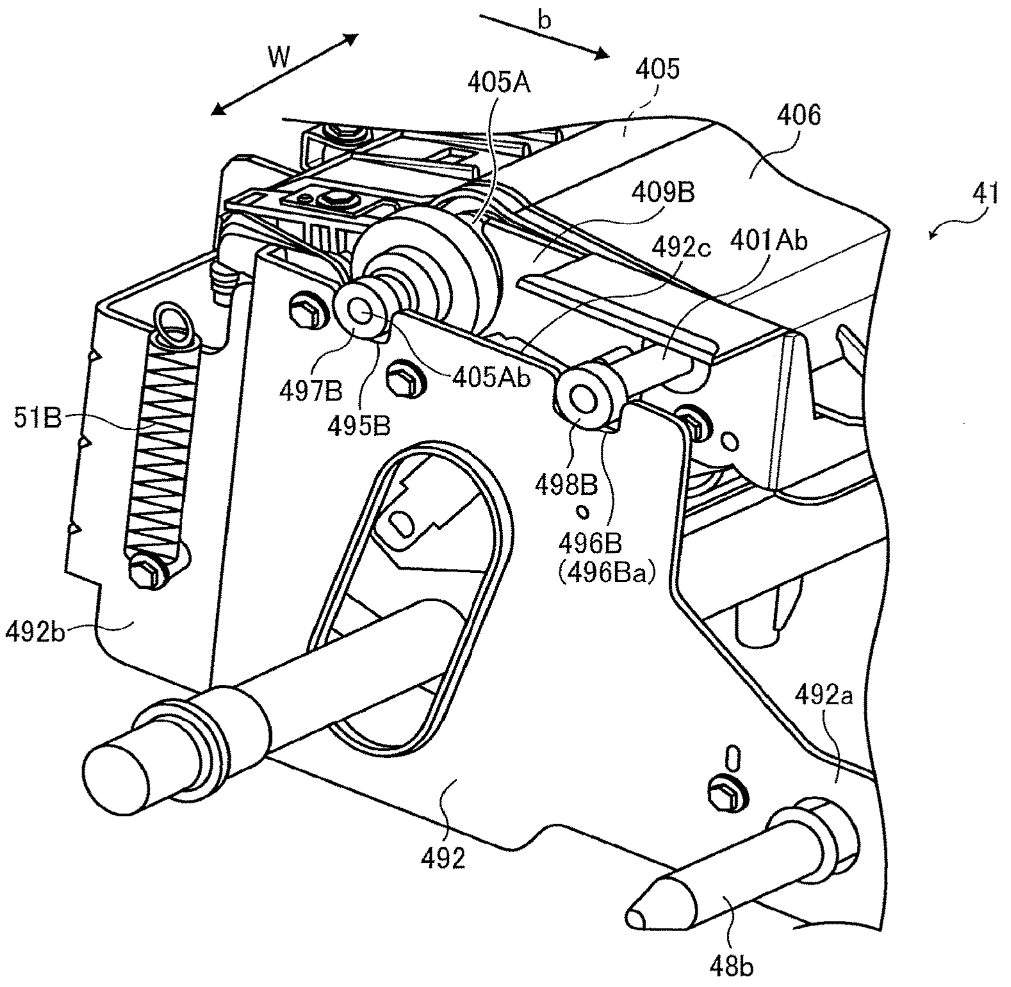
FIG. 9 is a perspective view of a support structure for another end of the shaft of the rotator to support the belt illustrated in FIG. 8.

Referring to FIG. 9, an upper side of the positioning portion 495B is open and is a recess. A ball bearing 497B attached to a second end 405Ab of the shaft 405A is put in the recess from above the upper face 492*c*. The positioning portion 495B has a width almost identical to the diameter of the ball bearing 497B. Thus, as the ball bearing 497B is fitted in the positioning portion 495B, the position of the ball bearing 497B is determined in the axial direction W and the sheet conveyance direction b.

The positioning portion 496B is recessed downward from the upper face 492*c* and serves as a recess into which a ball bearing 498B attached to a second end 401Ab of the shaft 401A of the separation roller 401 is put, from above. The positioning portion 496B has a width greater than the diameter of the ball bearing 498B. Thus, as the ball bearing 498B is held in the positioning portion 496B, the ball bearing 498B is mounted on a bottom 496Ba of the positioning portion 496B and supported movably in the axial direction W, the sheet conveyance direction b, and the vertical direction Z.

That is, in the present embodiment, in mounting the secondary transfer unit 41 in the pressing frame 49, the shaft 405A is used as a main reference for positioning without a play, and the shaft 401A is used as a sub-reference for positioning with a play. If there are various components up to the main reference, distortion is accumulated, increasing the possibility of variations in spring pressure. Since the number of components up to the shaft 405A is smaller, the shaft 405A is used as the main reference.

As described above, in the present embodiment, the intermediate transfer belt 31 and the secondary transfer belt 406 are elastic. Accordingly, compared with a configuration employing a belt that is not elastic, the pressing force applied to the pressing frame 49 is increased. Thus, the nip pressure in the secondary transfer nip N2 is raised, to attain preferable transfer of an image onto a sheet having a coarse surface.

Accordingly, when the secondary transfer unit 41 is attached to the pressing frame 49, differences in absolute value in the nip pressure is larger, even when the rate of deviation in the nip pressure is equivalent to that in a configuration in which the pressing force applied to the pressing frame 49 is not increased. Thus, the speed of belt deviation tends to be high. The term "belt deviation" means that the belt is drawn to one side in the width direction of the belt. Note that even in a case where an elastic belt is not used and the pressing force is not increased, the speed of belt deviation may fluctuate depending on assembling error when the secondary transfer unit 41 is attached to the pressing frame 49.

Figure 10A:
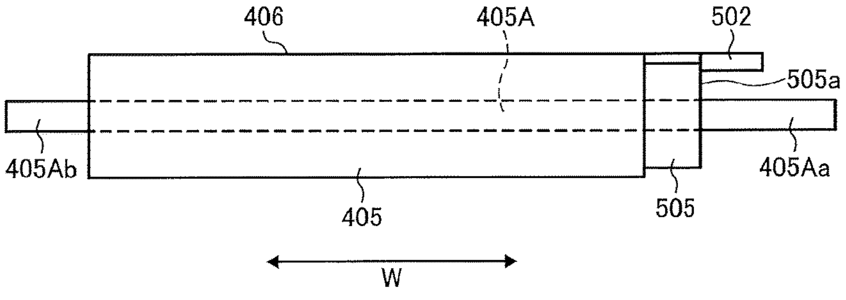
FIG. 10A is a schematic side view of the belt unit for understanding of belt deviation.

Referring to FIG. 10A, as another deviation restraint, a collar 505 is disposed on the first end 405Aa of the shaft

Figure 10B:
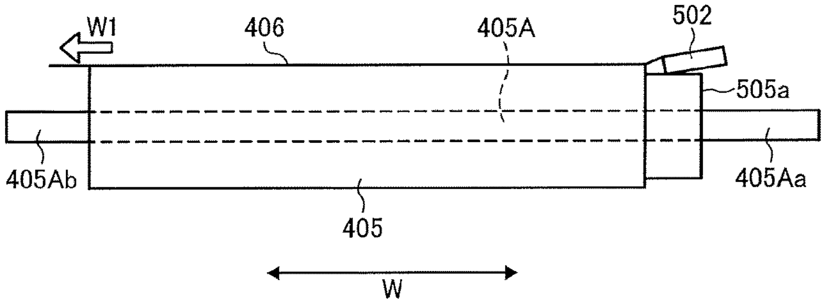
FIG. 10B is schematic side view of the belt unit at the occurrence of belt deviation.

405A of the secondary transfer roller 405. When the speed of deviation of the secondary transfer belt 406 is in a tolerable range, as illustrated in FIG. 10A, the belt guide 502 (the deviation restraint) is reliably kept in contact with an end face 505*a* of the collar 505. However, when the speed of deviation of the belt (in the direction indicated by arrow W1) is out of the tolerable range, as illustrated in FIG. 10B, the belt guide 502 as deviation restraint may overstride an end of the collar 505 and rides on the collar 505. The belt guide 502 overstriding the end of the collar 505 hinders the secondary transfer belt 406 from rotating reliably and one cause of unstable running of the secondary transfer belt 406.

Figure 11:
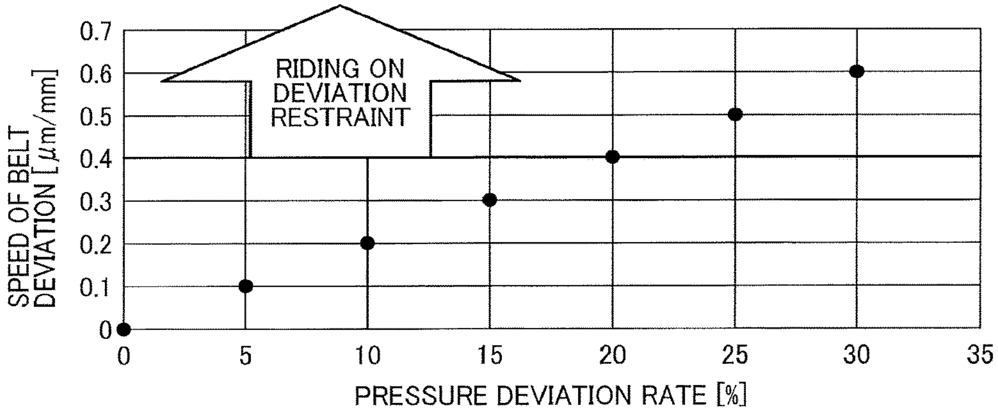
FIG. 11 is a graph of a relation between speed of deviation of belt and nip pressure.
Figure 12:
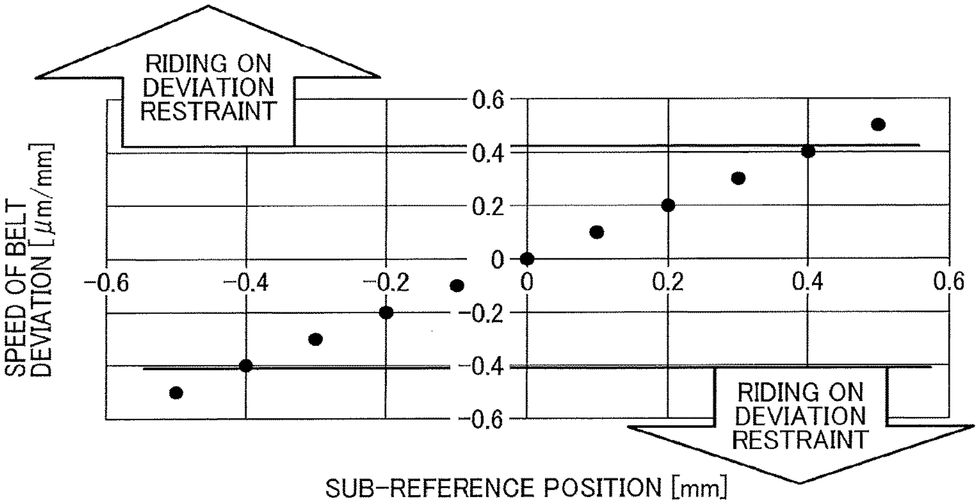
FIG. 12 is a graph of a relation between the speed of deviation of belt and a rotator support portion.
Figure 13:
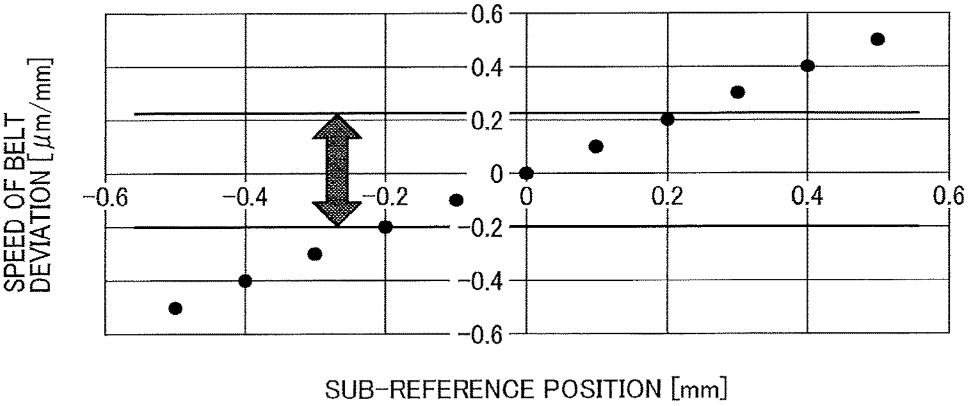
FIG. 13 is a graph of a relation between the speed of deviation of belt and the rotator support portion when the rotator support is adjusted.

FIGS. 11 through 13 are graphs of fluctuations in various parameters inherent to fluctuations in the speed of belt deviation. FIG. 11 is a graph of a relation between the speed of deviation of the secondary transfer belt 406 and the nip pressure (pressure in the secondary transfer nip N2). FIG. 12 is a graph of a relation between the speed of deviation of the secondary transfer belt 406 and a rotator support portion. The rotator support portion mentioned here is the positioning portion 496A (on a sub-reference side) that supports the first end 401Aa of the shaft 401A. FIG. 13 is a graph of a relation between the speed of deviation of the secondary transfer belt 406 and the rotator support portion when the rotator support portion is adjusted. The rotator support portion mentioned here is the positioning portion 496A (on a sub-reference side) that supports the first end 401Aa of the shaft 401A.

FIG. 11 illustrates a result of a test performed with the speed of belt deviation changed. In FIG. 11, the lateral axis represents the deviation rate in percent of the pressure of the secondary transfer nip N2 (between the front side and the rear side), and the vertical axis represents the speed of deviation of the secondary transfer belt 406 (μm/mm). In FIG. 11, the speed of belt deviation represents the amount in micron meters by which the secondary transfer belt 406 moves in the axial direction (belt width direction) while the secondary transfer belt 406 is driven by 1 mm.

According to FIG. 11, as the deviation in the nip pressure increases, the speed of deviation increases. When the speed of deviation exceeded 0.4 μm/mm, the belt guide 502 as deviation restraint rode on the collar 505 (hereinafter "ride of deviation restraint"). Note that the graph in FIG. 11 is made on the assumption that deviations of parameters other than the nip pressure are zero. For example, deviations in pressure of the first and second cleaning blades 411 and 421 that contact the secondary transfer belt 406 and deviations in position of rollers in the axial direction are not considered.

FIG. 12 is a graph illustrating results of a test performed with the sub-reference position of the secondary transfer unit 41 changed. In FIG. 12, the lateral axis represents the sub-reference position for the secondary transfer unit 41, and the vertical axis represents the speed of deviation (μm/mm). The lower side and the upper side in the vertical direction Z are a minus side and a plus side of the sub-reference position, respectively.

When the sub-reference position was shifted by 0.4 mm upward or downward, the speed of deviation exceeded 0.4 μm/mm, and the ride of deviation restraint occurred. The plus side and the minus side of the speed of deviation correspond to the deviation of the belt to the rear side and that to the front side, respectively.

FIG. 13 is a graph illustrating results of a test performed with the sub-reference position of the secondary transfer unit 41 changed. In FIG. 13, the lateral axis represents the sub-reference position (the lower side and the upper side in the vertical direction Z are the minus side and the plus side), and the vertical axis represents the speed of deviation (μm/mm). Differently from the test conditions for the result illustrated in FIG. 12, the deviation rate of the pressure of the secondary transfer nip N2 was equal to or lower than 10%.

When the deviation rate of the pressure of the secondary transfer nip N2 is thus limited, the deviation restraint is inhibited from riding on the collar 505 by the adjustment of the sub-reference position. Specifically, the ride of deviation restraint is inhibited when the first end 401Aa of the shaft 401A (the sub-reference) is adjusted to restrict the speed of belt deviation due to the change of the sub-reference position equal to or lower than 0.2 μm/mm. That is, the sub-reference position is adjusted to reduce the speed of deviation.

Figure 14A:
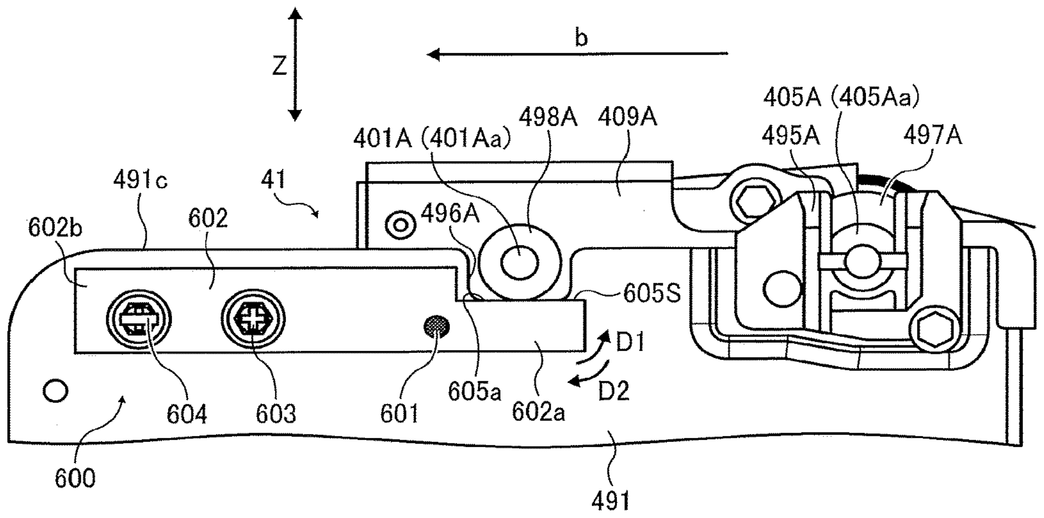
FIG. 14A is an enlarged view of an adjuster according to an embodiment.
Figure 14B:
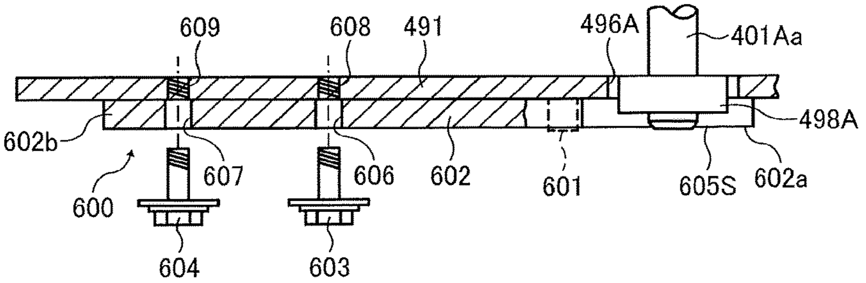
FIG. 14B is a cross-sectional view of the adjuster illustrated in FIG. 14A.

FIGS. 14A and 14B illustrate a configuration of an adjuster 600 to adjust the sub-reference position. In FIGS. 14A and 14B, the adjuster 600 is disposed on the front plate 491 on the front side of the pressing frame 49 (see FIG. 6) and attached to the first end 401Aa of the shaft 401A. The adjuster 600 adjusts the position of the ball bearing 498A held by the positioning portion 496A. The position of the ball bearing 498A is adjusted in the vertical direction Z. The adjuster 600 includes an adjuster plate 602 and screws 603 and 604 to secure the position of the adjuster plate 602. The adjuster plate 602 is supported to rotate around a shaft 601 disposed in the pressing frame 49. In the sub-reference, the adjuster 600 is located on the front side of the image forming apparatus 100.

The adjuster plate 602 includes a step 605S on a side of a first end 602*a*. When the adjuster plate 602 is in a horizontal position and secured by the screws 603 and 604, a bottom 605*a* of the step 605S is in parallel to the horizontal bottom 496Aa (see FIG. 8) of the positioning portion 496A. The horizontal position of the adjuster plate 602 is a home position (reference position) thereof. The plus direction in FIG. 13 corresponds to the direction in which the adjuster plate 602 is rotated to lift the bottom 605*a* above the bottom 496Aa of the positioning portion 496A as indicated by arrow D1. The minus direction in FIG. 13 corresponds to the direction in which the adjuster plate 602 is rotated to descend the bottom 605*a* lower than the bottom 496Aa of the positioning portion 496A as indicated by arrow D2.

On a side of a second end 602*b* of the adjuster plate 602 opposite the step 605S across the shaft 601, as illustrated in FIG. 14B, through holes 606 and 607 are formed to penetrate the screws 603 and 604, respectively. The through hole 607, which is further one of the through holes 606 and 607 from the shaft 601, extends long in the vertical direction Z. The adjuster plate 602 is secured to the front plate 491, and the front plate 491 has screw holes 608 and 609 opposite the through holes 606 and 607, respectively. To secure the adjuster plate 602 to the front plate 491, the position of the adjuster plate 602 is adjusted, and the screws 603 and 604 are screwed into the through holes 606 and 607.

To adjust the speed of belt deviation with the adjuster 600, initially, the adjuster plate 602 is placed in the horizontal position (the home position) and attached to the front plate 491. In this state, when the speed of belt deviation is within a predetermined range (e.g., equal to or smaller than 0.2 μm/mm as described with reference to FIG. 13), the adjustment is not necessary.

If the speed of belt deviation exceeds the predetermined range (e.g., 0.2 μm/mm) with the adjuster plate 602 disposed horizontally, an operator performs the adjustment. Specifically, the operator loosens the screws 603 and 604, moves the adjuster plate 602, for example, by 0.1 mm in the direction D1, and tightens the screws 603 and 604 to secure the adjuster plate 602. Then, the operator measures the speed of belt deviation. If the speed of belt deviation is equal to or lower than 0.2 μm/mm, the adjustment is completed. After the adjuster plate 602 is moved by 0.1 mm, if the speed of belt deviation is not suppressed, the operator moves the adjuster plate 602 further by 0.1 mm in the direction D1. Then, the operator measures the speed of belt deviation. Here, in a case where the speed of belt deviation increases in the plus direction, the adjuster plate 602 is moved by 0.1 mm in the direction D2 relative to the horizontal position (home position) and secured by the screws 603 and 604. Then, the operator measures the speed of belt deviation. If the speed of belt deviation is equal to or lower than 0.2 μm/mm, the adjustment is completed.

Since the transfer device 40 includes the adjuster 600 to adjust the twist of the secondary transfer belt 406 relative to the pressing frame 49, the speed of belt deviation can be adjusted. Accordingly, the belt guide 502 of the secondary transfer belt 406 is inhibited from riding on the collar 505 (deviation restraint), and the secondary transfer belt 406 can run reliably. Specifically, the adjuster 600 adjusts the position of the ball bearing 498A attached to the first end 401Aa of the shaft 401A and held by the positioning portion 496A, and the shaft 401A serves as at least one of a plurality of supports. Accordingly, the transfer device 40 and the image forming apparatus 100 according to the present embodiment can stabilize the running of the belt in a simple manner.

In the transfer device 40 (i.e., the belt device) including the secondary transfer belt 406, as the running of the secondary transfer belt 406 is stabilized, conveyance of the recording sheet P that passes through the secondary transfer nip N2 is stabilized. Further, the toner image can be reliably transferred from the intermediate transfer belt 31 and reliably conveyed. Thus, good transfer performance is attained. Disposing the adjuster 600 on the front side of the apparatus body 100A makes it easier to adjust the position while checking the speed of belt deviation, in a state in which the secondary transfer unit 41 is mounted in the apparatus body 100A. Thus, workability is improved, leading to improvement in positioning accuracy. To stabilize the running of the secondary transfer belt 406, a conceivable approach is to provide a plurality of ball bearings 498A different in size, and, from the plurality of ball bearings 498A, to select one ball bearing that stabilizes the running of the secondary transfer belt 406 most. This approach, however, involves attaching and removing the plurality of ball bearings to and from the shaft 401A one by one, and the adjustment work is burdensome. Another conceivable approach is to shave the positioning portion 496A with a cutting tool little by little until the running of the secondary transfer belt 406 is stabilized most. This approach is burdensome similarly. According to the present embodiment, with the adjuster 600 to adjust the position of the ball bearing 498A, the burdensomeness described above is eliminated.

In the present embodiment, in attaching the secondary transfer unit 41 (i.e., the belt device) to the pressing frame 49, the secondary transfer unit 41 is supported by the four supports, namely, both ends of the shaft 405A and both ends of the shaft 401A. At least one of the four supports is provided with the adjuster 600 to make the position of the positioning portion of the plurality of supports adjustable relative to other positioning portions.

In the present embodiment, of the plurality of rotators around which the secondary transfer belt 406 is looped, the shaft 405A (both end thereof in particular) of the secondary transfer roller 405 is used as the main reference and the shaft 401A (both end thereof in particular) of the separation roller 401 is used as the sub-reference in adjusting the positions of the secondary transfer unit 41 and the pressing frame 49. The shaft 405A is used as the main reference to stabilize the positions of the secondary transfer roller 405 and the secondary-transfer backup roller 33, thereby stabilizing the secondary transfer nip N2. By contrast, the shaft 401A is made the sub-reference from the following reason. The secondary transfer belt 406 is looped around the secondary transfer roller 405 and the separation roller 401 having the shaft 401A, and the separation roller 401 and the secondary transfer belt 406 together form a face to convey the recording sheet P downstream from the secondary transfer nip N2 in the sheet conveyance direction. Further, the shaft 401A is disposed close to a conveyor to convey the recording sheet P toward the fixing device 90 and forwards the recording sheet P that has passed through the secondary transfer nip N2 to the conveyor. That is, the shaft 401A is made the sub-reference to stabilize the conveyance of the recording sheet P that has passed through the secondary transfer nip N2.

Figure 15:
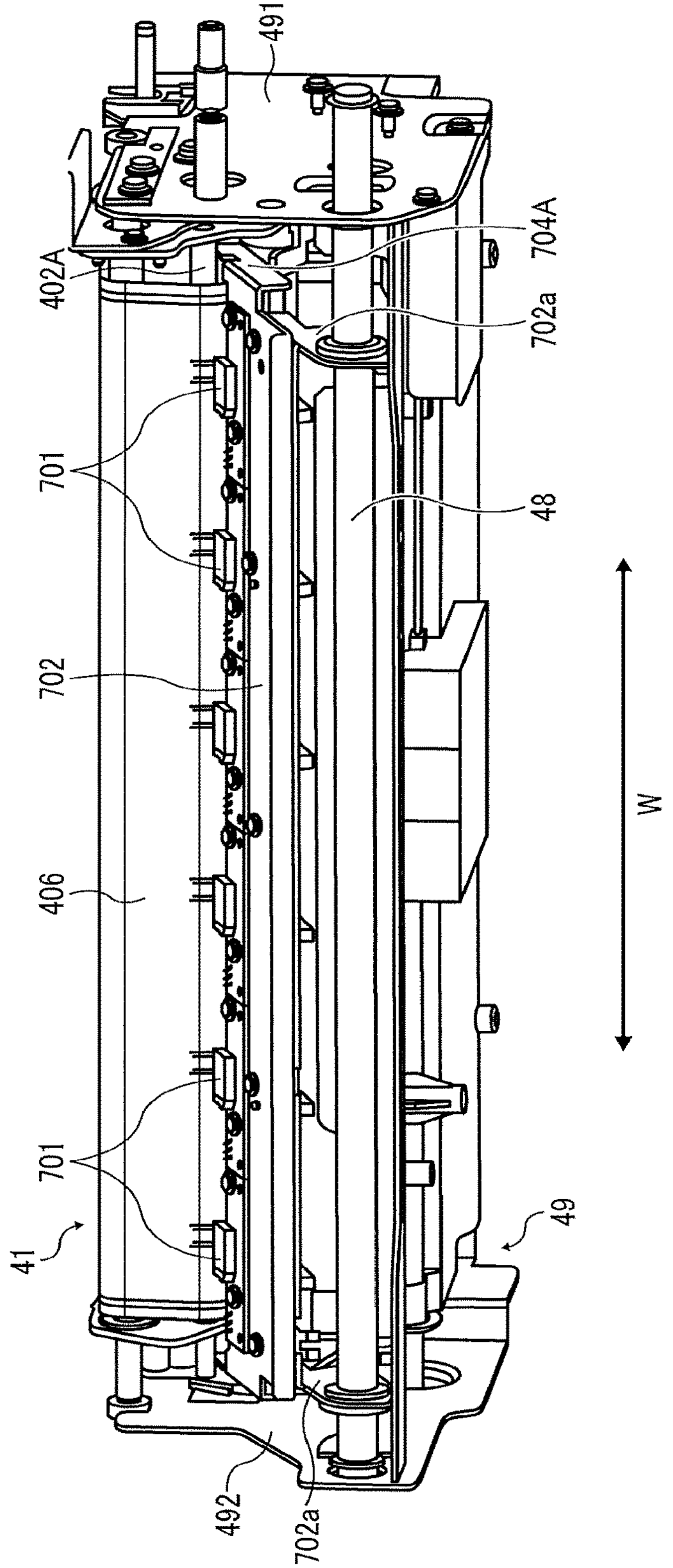
FIG. 15 is a perspective view illustrating location of sensors and a sensor bracket of the transfer device illustrated in FIG. 4.

Onto the secondary transfer belt 406, a toner image for image density adjustment (adjustment toner pattern) is transferred. Accordingly, as illustrated in FIG. 15, the secondary transfer unit 41 includes a plurality of density sensors 701 to detect the density of the toner image. The density sensors 701 are lined in the axial direction W and face the secondary transfer belt 406. More specifically, the density sensors 701 are disposed opposite the driven roller 402 via the secondary transfer belt 406. When the density of the toner image is detected in a portion of the secondary transfer belt 406 wound round the driven roller 402, which does not flutter, can be detected with a stable detection accuracy. A controller 200 (illustrated in FIG. 1) of the image forming apparatus 100 adjusts the densities of the toner images formed on the photoconductors 2Y, 2M, 2C, and 2K based on the densities of yellow, magenta, cyan, and black toner patterns detected by the density sensors 701.

When the first end 401Aa of the shaft 401A of the separation roller 401, which is the sub-reference for the positioning of the adjuster plate 602 of the adjuster 600, is moved, accuracy may be degraded in alignment of a component of another unit or a frame relative to the secondary transfer unit 41. In the present embodiment, the alignment of the density sensors 701 relative to the secondary transfer belt 406 may be degraded.

Figure 16:
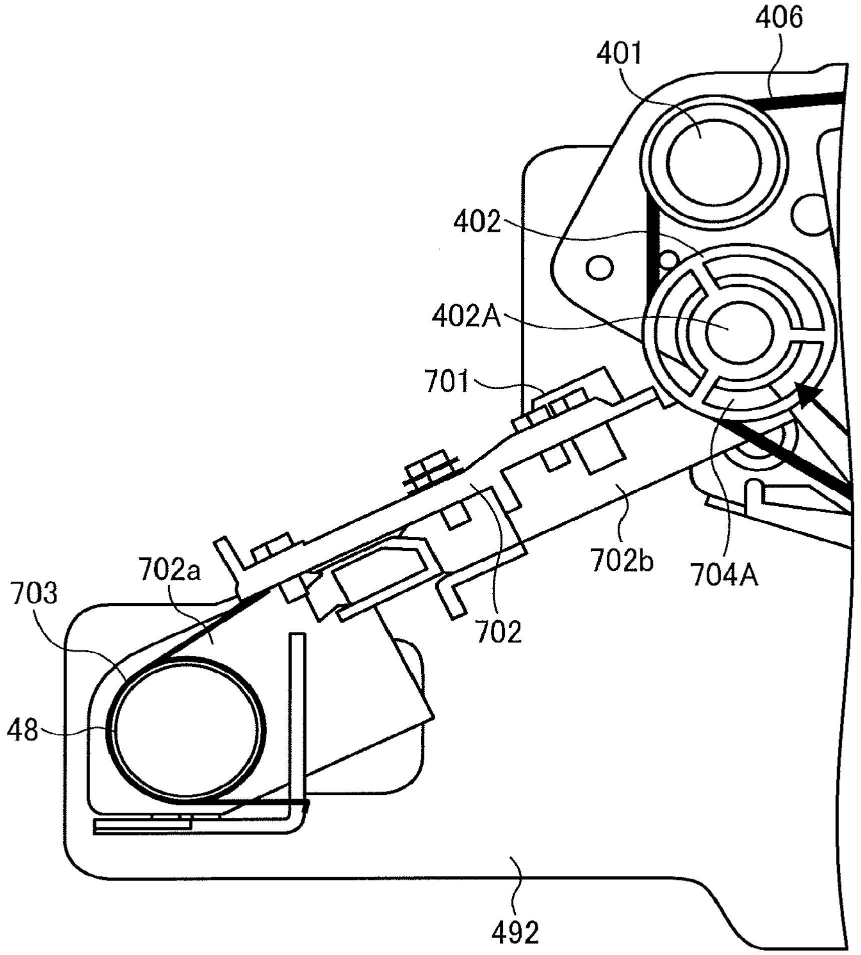
FIG. 16 is a cross-sectional view of the sensors and the sensor bracket illustrated in FIG. 15, as viewed in the axial direction of the rotator.

Accordingly, in the present embodiment, the positioning is made not to degrade the accuracy in positioning of the density sensors 701. As illustrated in FIG. 16, the density sensors 701 are secured to a sensor bracket 702, and a first end **702*a* of the sensor bracket 702 is pivotably supported by the support shaft 48 (a bracket support), via which the pressing frame 49 is attached to the apparatus body 100A. Since the position of the support shaft 48 is fixed, the support shaft 48 serves as the fulcrum for pivoting (or swinging) of the sensor bracket 702 and a main reference in pivoting of the sensor bracket 702. A torsion coil spring 703 (in FIG. 16) winding around the support shaft 48 biases the sensor bracket 702 toward a shaft 402A of the driven roller 402. In FIGS. 14A and 14B, the torsion coil spring 703** is omitted for simplicity.

Figure 17:
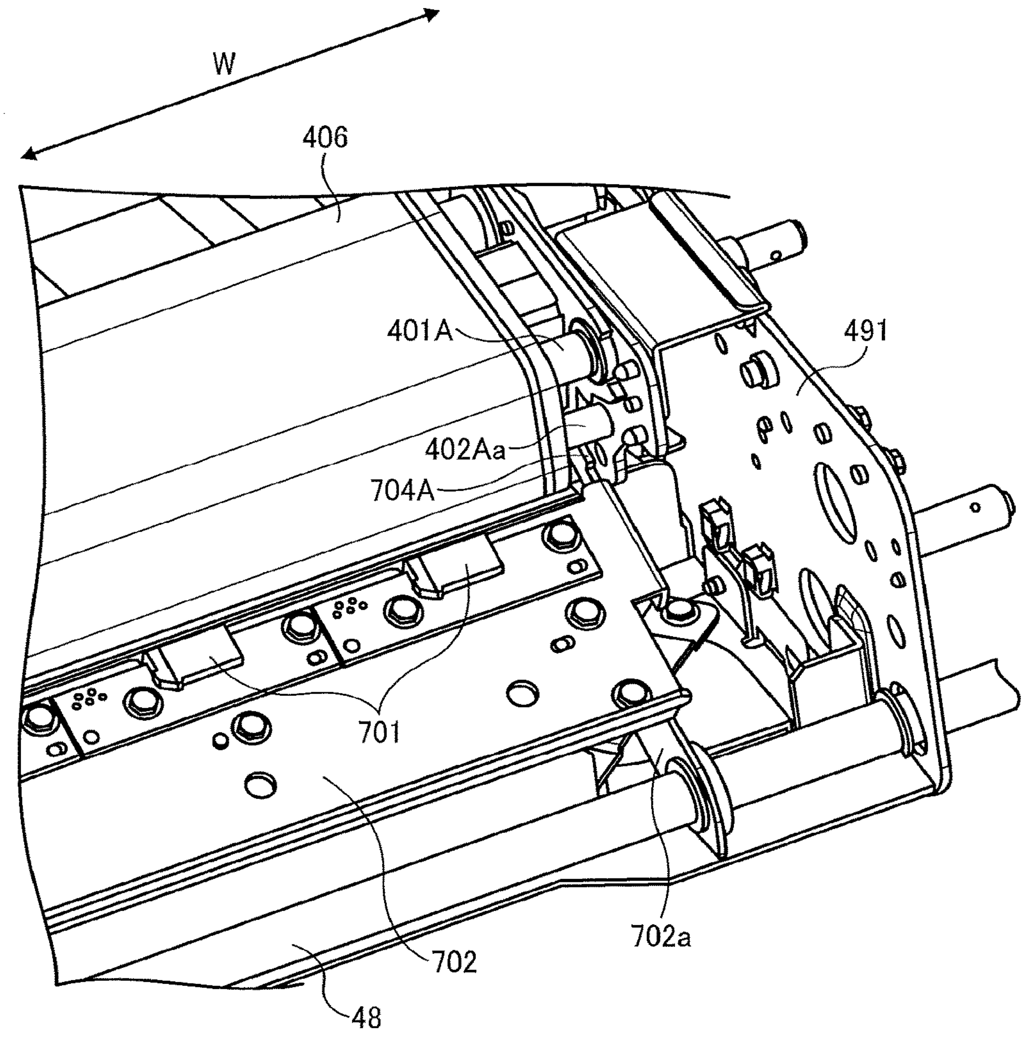
FIG. 17 is a perspective view of an end of the sensor bracket illustrated in FIG. 16.
Figure 18:
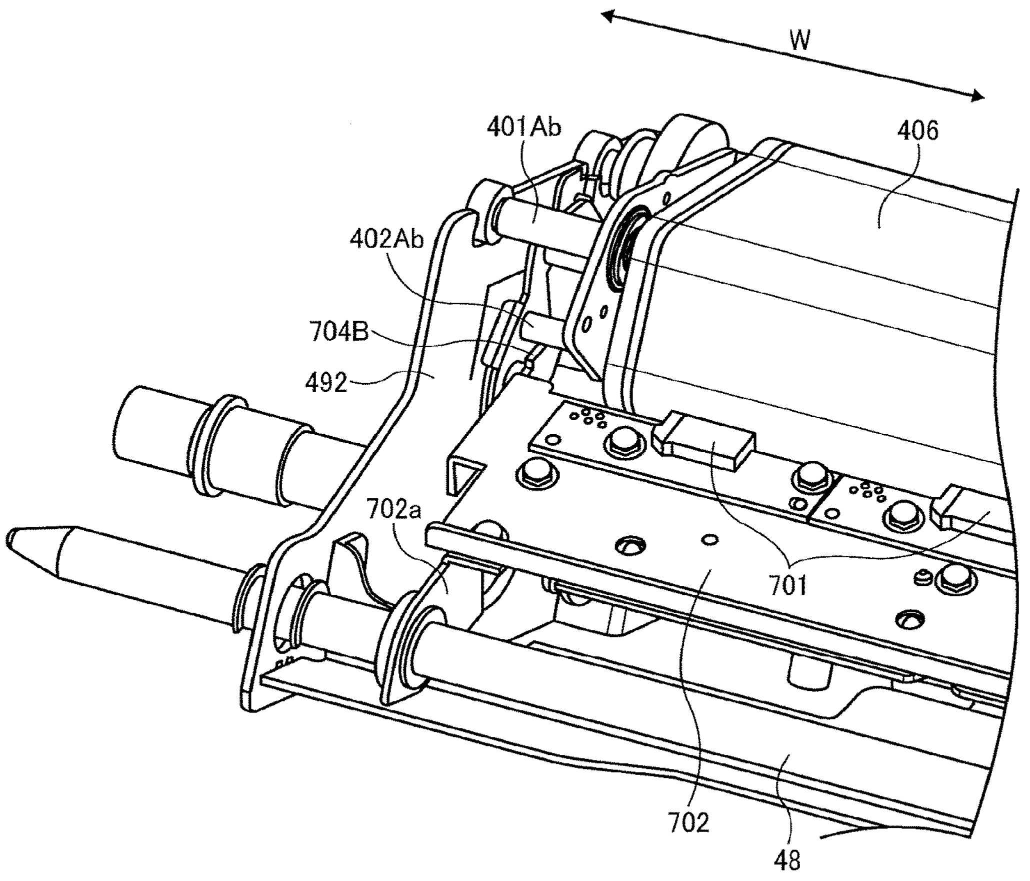
FIG. 18 is a perspective view of another end of the sensor bracket illustrated in FIG. 16.

As illustrated in FIGS. 17 and 18, a second end of the sensor bracket 702 includes contact portions 704A and 704B spaced apart in the axial direction W. The contact portions 704A and 704B contact (press against) the shaft 402A. As illustrated in FIG. 17, the contact portion 704A is in contact with a first end 402Aa of the shaft 402A. As illustrated in FIG. 18, the contact portion 704B is in contact with a second end 402Ab of the shaft 402A. That is, the portions where the contact portions 704A and 704B contact the shaft 402A are sub-references.

Thus, the sensor bracket 702 supporting the density sensors 701 is disposed in contact with the shaft 402A of the driven roller 402 to determine the position thereof. Accordingly, even when the position of the first end 401Aa of the shaft 401A is adjusted by the adjuster 600, the accuracy in relative positions of the density sensors 701 and the driven roller 402 can be maintained. This structure is effective in stabilizing the detection accuracy. Since the sensor bracket 702 that pivots on the support shaft 48 is biased by the torsion coil spring 703 toward the shaft 402A, it is not necessary to lift the sensor bracket 702 each time the density sensors 701 are mounted thereon, thus improving the workability.

Note that the density sensors 701 can be disposed facing a portion of the secondary transfer belt 406 that is not supported by the driven roller 402. In this case, similarly, as the sensor bracket 702 supporting the density sensors 701 is aligned with the secondary transfer unit 41, the accuracy in relative positions of the density sensors 701 and the driven roller 402 can be maintained.

Note that in addition to or instead of the density sensors 701, the image forming apparatus 100 can include an image position sensor to detect positions of toner images (toner patterns) for adjustment of displacement of images or misalignment in superimposition of colors. The controller 200 (illustrated in FIG. 1) of the image forming apparatus 100 adjusts the positions and formation tunings of the toner images on the photoconductors 2Y, 2M, 2C, and 2K based on the detection of yellow, magenta, cyan, and black toner patterns made by the image position sensor. When the toner pattern is detected in the portion of the secondary transfer belt 406 wound round the driven roller 402, the detection accuracy can be stable. Additionally, aligning the sensor bracket 702 supporting the image position sensor relative to the secondary transfer unit 41 (belt unit) is effective in maintaining the accuracy in relative positions of the image position sensor and the driven roller 402.

Note that the image position sensor can be disposed facing a portion of the secondary transfer belt 406 that is not supported by the driven roller 402. In this case, similarly, when the image position sensor is mounted on the sensor bracket 702 and the sensor bracket 702 is aligned with the secondary transfer unit 41, the accuracy in relative positions of the sensor and the driven roller 402 can be maintained.

As a comparative example, if the coil springs 51A and 51B are disposed inside the secondary transfer unit 41, the following inconvenience may occur in adjustment by the adjuster 600. As the spring lengths of the coil springs 51A and 51B change, the deviation in nip pressure tends to be large, and transferability of the toner image tends to vary in the front-back direction of the image forming apparatus 100. By contrast, in the present embodiment, the coil springs 51A and 51B bias the pressing frame 49 in the upward direction (i.e., predetermined direction) indicated by arrow c to generate the nip pressure in the secondary transfer nip N2. In other words, the coil springs 51A and 51B are disposed outside the secondary transfer unit 41. Accordingly, the adjustment by the adjuster 600 does not move the pressing frame 49, and the spring lengths of the coil springs 51A and 51B (biasing the pressing frame 49) do not change. Therefore, deviations in the nip pressure are small before and after the adjustment of twist of the secondary transfer belt 406. In the present embodiment, the pressing structure to press the secondary transfer unit 41 is provided separately from the secondary transfer unit 41, and the pressing structure presses the entire secondary transfer unit 41. Accordingly, twist adjustment performed inside the secondary transfer unit 41 does not affect the pressed state of the secondary transfer belt 406 and can suppress the twist of the secondary transfer belt 406 due to a twist of the roller. Then, variations in the speed of belt deviation are suppressed, and deviation (or skew) of the secondary transfer belt 406 is inhibited.

Another embodiment is described below with reference to FIGS. 19 to 27.

In the above-described embodiment, the support shaft 48 supports the sensor bracket 702, and the pressing frame 49 and the sensor bracket 702 are coaxial with each other and pivotable on the support shaft 48. By contrast, in the embodiment illustrated in FIG. 19, a sensor bracket 802 and the pressing frame 49 are individually pivotable on different support shafts. Specifically, although the speed of deviation of the secondary transfer belt 406 is adjusted relative to the support shaft 48 serving as a fulcrum of the pressing frame 49 in the above-described embodiment, in the present embodiment, the position of the support of the sensor bracket 802 and the speed of belt deviation are adjustable relative to the secondary transfer belt 406 (the secondary transfer unit 41).

The secondary transfer unit 41 and the pressing frame 49 of the present embodiment are similar to those of the above-described embodiment, but configurations of the sensor bracket 802 and an adjuster 600A are different from the corresponding parts of the above-described embodiment. The features of the present embodiment are described focusing on such differences.

Figure 19:
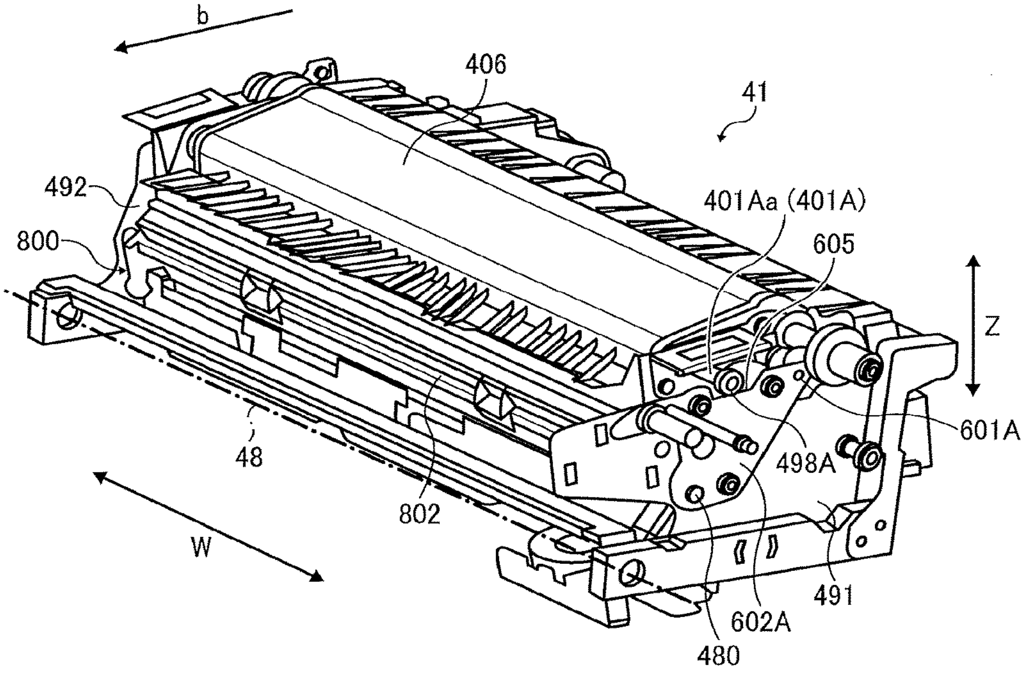
FIG. 19 is a perspective view illustrating an exterior of a transfer device according to another embodiment.
Figure 20:
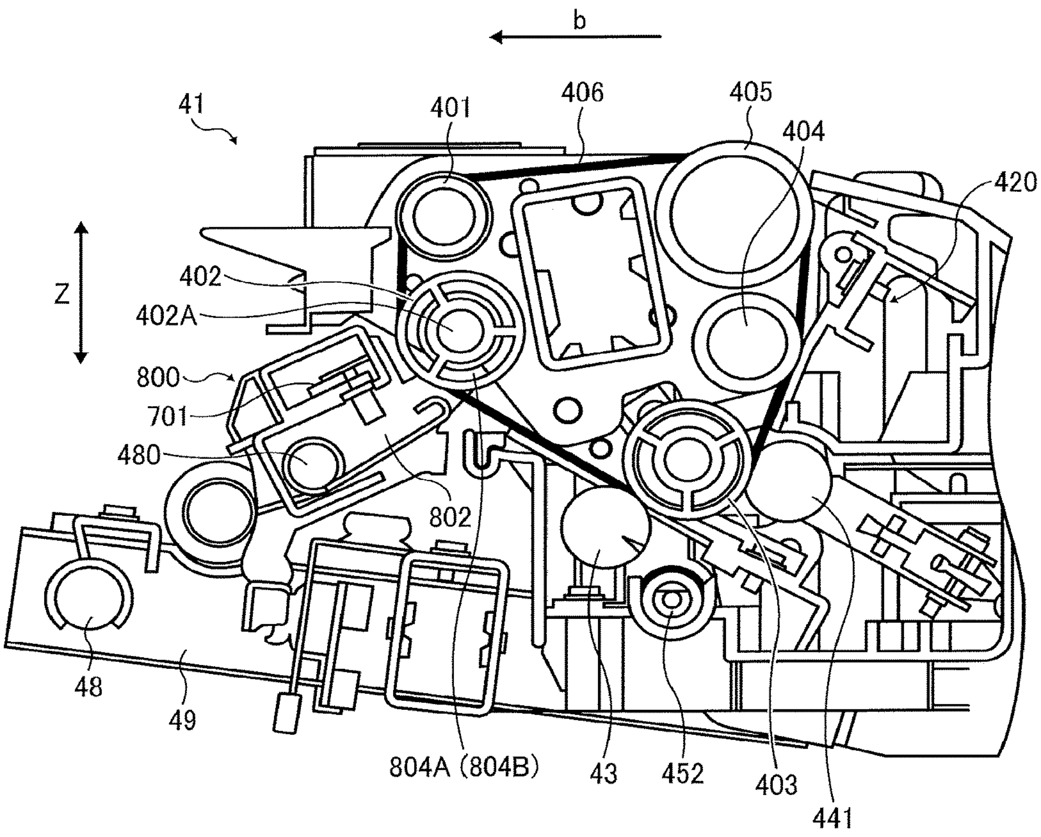
FIG. 20 is a side view illustrating an interior of the transfer device illustrated in FIG. 19.
Figure 21:
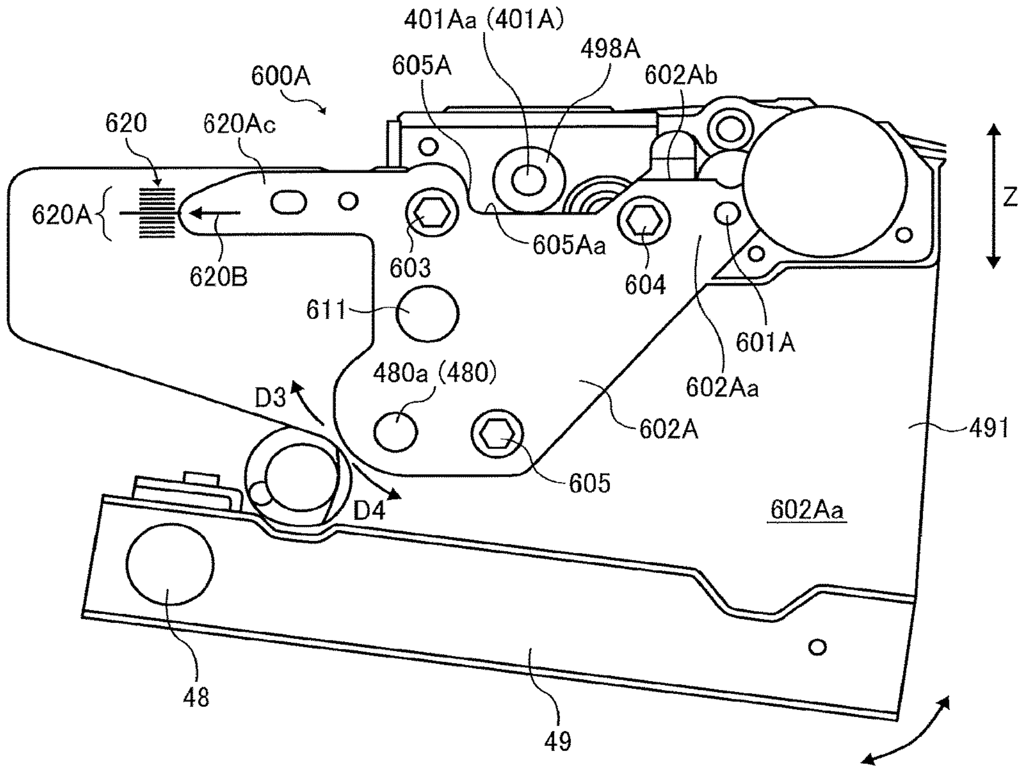
FIG. 21 is a side view of the transfer device illustrated in FIG. 19.
Figure 22A:
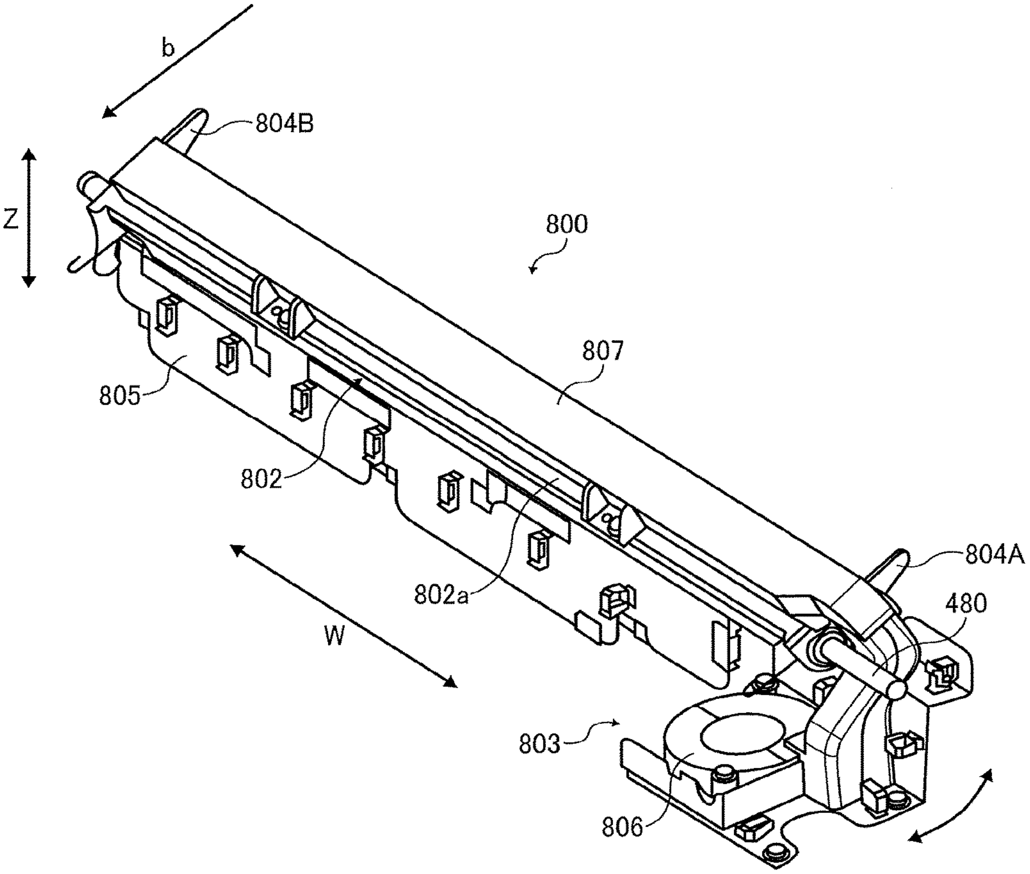
FIGS. 22A and 22B are perspective views of a structure to support a sensor in the configuration illustrated in FIG. 19.
Figure 22B:
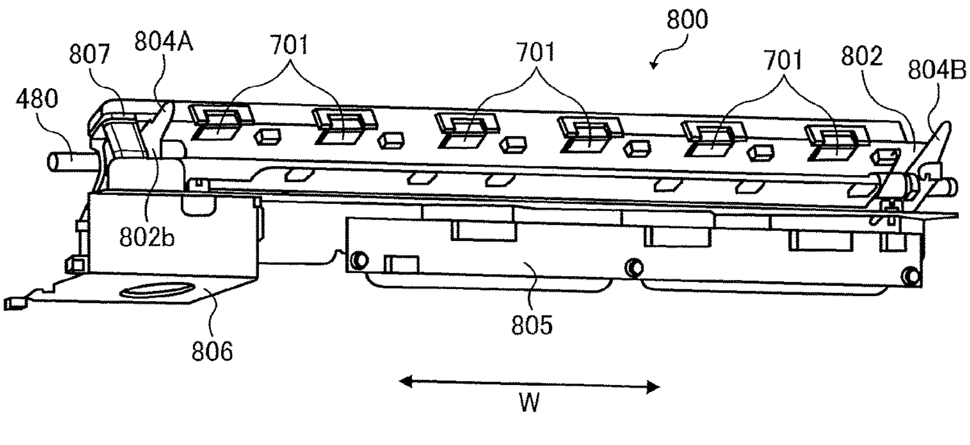

In the present embodiment, as illustrated in FIGS. 19 through 21, the pressing frame 49 is supported by the support shaft 48 and pivotable on the support shaft 48. By contrast, the density sensors 701 are pivotably supported by a sensor support shaft 480 (a bracket support)), and the sensor support shaft 480 is supported by the pressing frame 49 at a position different from the support shaft 48. As illustrated in FIGS. 22A and 22B, the plurality of density sensors 701 is mounted on the sensor bracket 802 shaped like a plate extending in the axial direction W. A first end 802*a* of the sensor bracket 802 is supported by the sensor support shaft 480. A second end 802*b* of the sensor bracket 802 includes contact portions 804A and 804B spaced apart in the axial direction W. The contact portions 804A and 804B contact (press against) the shaft 402A of the driven roller 402. Similar to the sensor bracket 702, the contact portions 804A and 804B are disposed in contact with the first end 402Aa and the second end 402Ab of the shaft 402A, respectively. That is, the portions where the contact portions 804A and 804B contact the shaft 402A are sub-references, and the sensor support shaft 480 is used as the main reference in the positioning.

In the present embodiment, the sensor bracket 802 is provided with a support stand 805. The secondary transfer unit 41 further includes a fan cleaner 803 disposed on the support stand 805. The fan cleaner 803 blows air to clean the density sensors 701. The fan cleaner 803 includes a fan 806 and a duct 807 to guide the airflow generated by the fan 806 in the axial direction W. The density sensors 701, the sensor bracket 802, and the fan cleaner 803 together construct a sensor unit 800.

Figure 23:
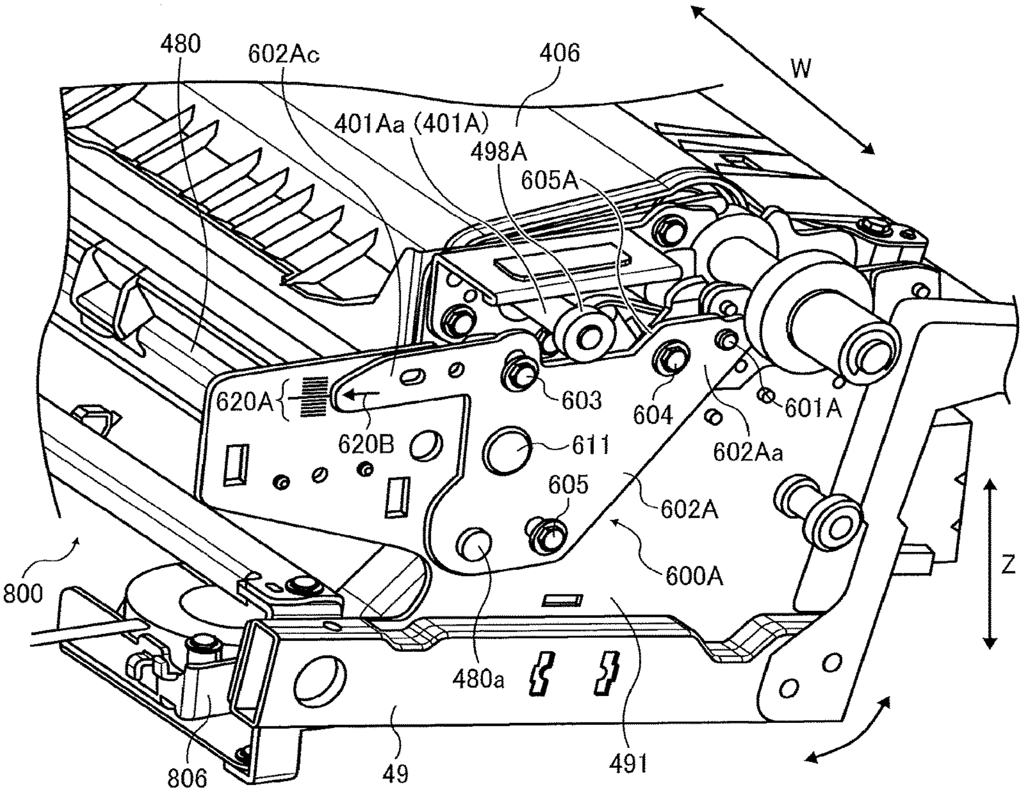
FIG. 23 is a perspective view of an adjuster in the configuration illustrated in FIG. 19.
Figure 24:
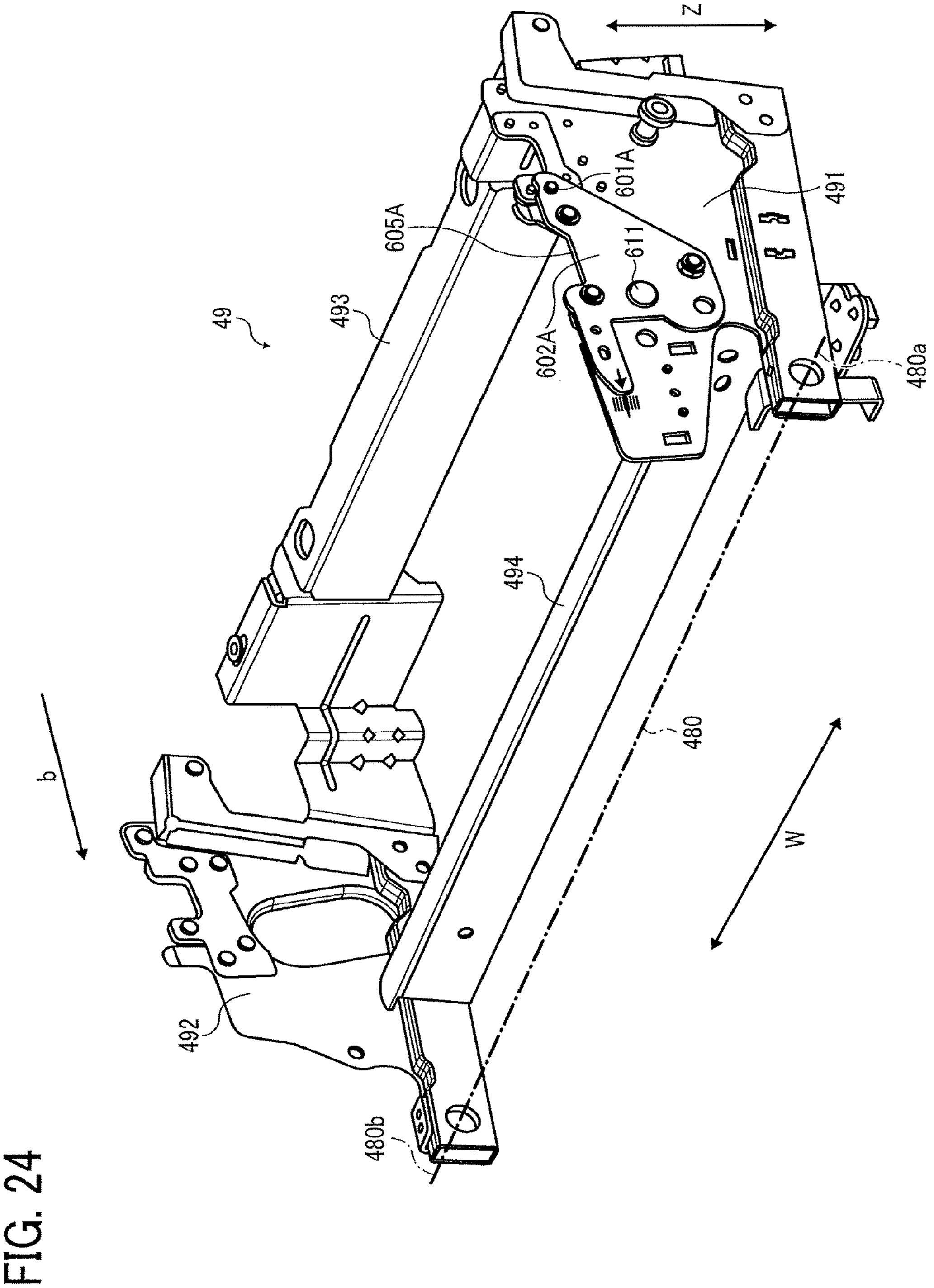
FIG. 24 is a perspective view of a pressing frame in the configuration illustrated in FIG. 19.
Figure 25:
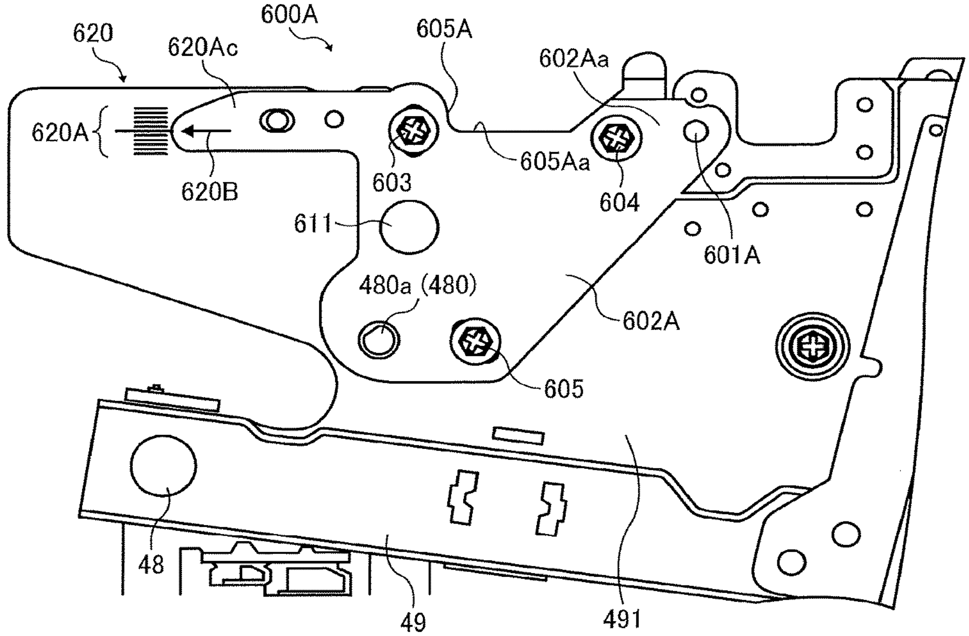
FIG. 25 illustrates an adjuster plate of the adjuster being at a reference position, in the configuration illustrated in FIG. 24.

Next, descriptions are given below of an adjuster 600A according to the present embodiment. As illustrated in FIGS. 21 and 23, the adjuster 600A is to adjust sub-reference positions of the pressing frame 49 (the secondary transfer unit 41) and the sensor unit 800 (the density sensors 701).

The adjuster 600A is disposed on the front plate 491 of the pressing frame 49 and configured to adjust the position of the ball bearing 498A attached to the first end 401Aa of the shaft 401A and the position of the sensor support shaft 480. The positions of the ball bearing 498A and the sensor support shaft 480 are adjusted in the vertical direction Z. The adjuster 600A includes an adjuster plate 602A having an end 602Aa (in FIG. 21) pivotably supported by a shaft 601A disposed on the front plate 491 of the pressing frame 49. The adjuster 600A further includes screws 603, 604, and 605 to secure the position of the adjuster plate 602A.

An upper side 602Ab of the adjuster plate 602A includes a recess 605A. A bottom 605Aa of the recess 605A is horizontal when the adjuster plate 602A is secured in a horizontal position illustrated in FIG. 25. The horizontal position of the adjuster plate 602A is a home position (reference position) thereof. Rotating (pivoting) the adjuster plate 602A in the direction indicated by arrow D3 in FIG. 26 corresponds to the movement in the plus direction in FIG. 13. Rotating (pivoting) the adjuster plate 602A in the direction indicated by arrow D4 in FIG. 27 corresponds to the movement in the minus direction in FIG. 13. The pivoting of the adjuster plate 602A is guided by a guide pin 611 (illustrated in FIGS. 24 to 26) attached to the front plate 491.

Figure 26:
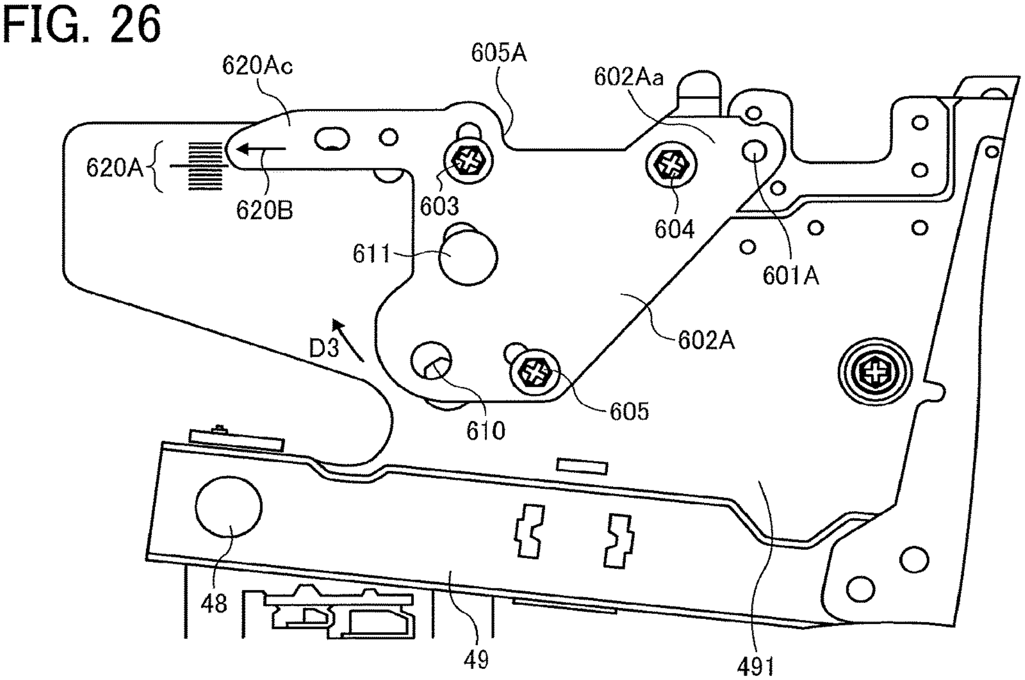
FIG. 26 is a side view of the adjuster illustrated in FIG. 25, for understanding of upward adjustment.
Figure 27:
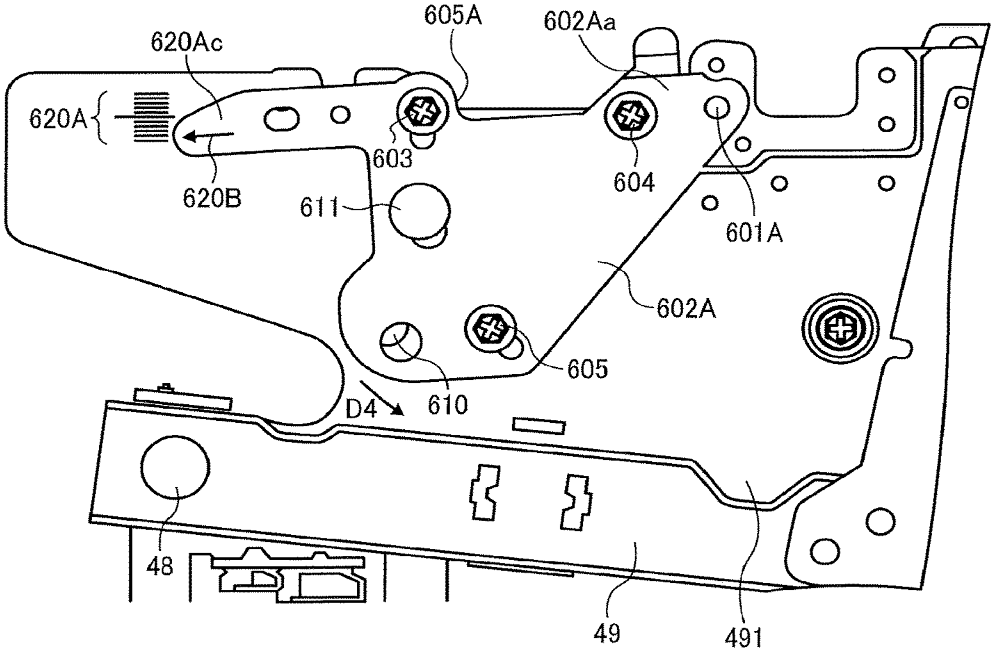
FIG. 27 is a side view of the adjuster illustrated in FIG. 25, for understanding of downward adjustment.

A first end 480*a* of the sensor support shaft 480 penetrates the front plate 491 and is supported by the adjuster plate 602A. A second end 480*b* (illustrated in FIG. 24) of the sensor support shaft 480 is supported by the rear plate 492. The first end 480*a* of the sensor support shaft 480 is movable relative to the front plate 491 when the sensor support shaft 480 rotates around the shaft 601A. Specifically, as illustrated in FIG. 26, the front plate 491 has a hole 610 for the first end 480*a* to penetrate the front plate 491. The hole 610 has a size and a shape to allow the first end 480*a* of the sensor support shaft 480 to move.

A second end 620Ac of the adjuster plate 602A includes a movement amount indicator 620 to indicate the amount by which the adjuster plate 602A has moved. The movement amount indicator 620 includes a scale 620A disposed on the front plate 491 and an arrow-shaped indicator 620B disposed at the second end 620Ac of the adjuster plate 602A. The scale 620A includes measurement marks arranged in the vertical direction at regular intervals. With the movement amount indicator 620, the operator can check the amount of movement of the adjuster plate 602A with eyes.

As described above, the sensor support shaft 480 serves as the fulcrum of pivoting of the sensor unit 800 (the density sensors 701) and is supported by the adjuster plate 602A that adjusts the sub-reference position of the pressing frame 49 (the secondary transfer unit 41). Accordingly, even in the configuration in which the sensor support shaft 480 is different from the support shaft 48 of the pressing frame 49, when the pressing frame 49 (the secondary transfer unit 41) rotates around the support shaft 48 and the ball bearing 498A to support the shaft 401A of the separation roller 401 moves, the adjuster plate 602 can be moved to adjust the position of the ball bearing 498A. As a result, the inclination of the secondary transfer unit 41 relative to the pressing frame 49 can be adjusted, to adjust the speed of deviation of the secondary transfer belt 406 to a suitable range. As the pressing frame 49 (the secondary transfer unit 41) rotates, the position of the density sensor 701 relative to the secondary transfer unit 41 changes, and the angle of the density sensor 701 relative to the secondary transfer belt 406 changes. In the present embodiment, since the first end 480*a* of the sensor support shaft 480 is supported by the adjuster plate 602A, the sensor unit 800 (the density sensor 701) moves in accordance with the amount by which the pressing frame 49 (the secondary transfer unit 41) is moved by the adjuster plate 602A. Accordingly, the angle of the sensor unit 800 (the density sensor 701) relative to the front face 406*b* of the secondary transfer belt 406 of the secondary transfer unit 41 does not change. The relative positions of the secondary transfer belt 406 and the density sensor 701 are maintained with a high degree of accuracy, enabling reliable detection of toner image density.

Since the sensor bracket 802 is supported rotatably around the sensor support shaft 480, the structure to support the sensor bracket 802 is simple. Further, the sensor support shaft 480 is attached to the pressing frame 49 supporting the secondary transfer unit 41. This structure reduces tolerances between the sensor bracket 802 and the secondary transfer unit 41 and improves the accuracy in the relative positions of the secondary transfer belt 406 and the density sensor 701, enabling reliable detection of toner image density.

Figure 28:
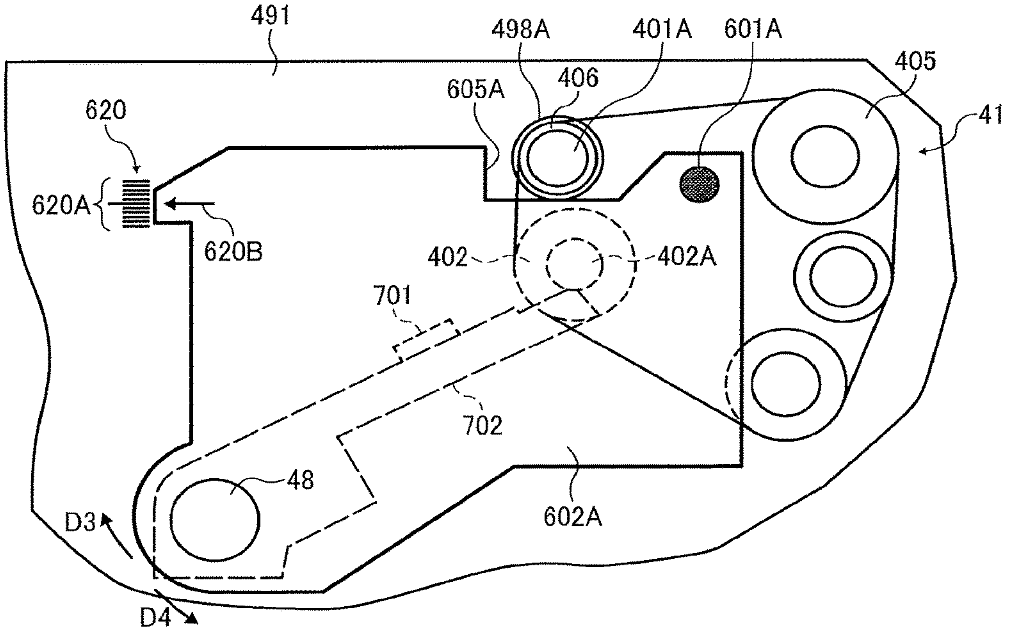
FIG. 28 is a pressing frame according to a variation.

Note that the adjustment with the adjuster plate 602A can be applicable to not only the configuration in which the sensor support shaft 480 is different from the support shaft 48 of the pressing frame 49 but a configuration illustrated in FIG. 28, in which the sensor bracket 702 and the pressing frame 49 (the secondary transfer belt 406) are supported to pivot coaxially with each other.

In the embodiment described above, the recording sheet P passes through the secondary transfer nip N2 (the transfer position) in a horizontal direction. Alternatively, aspects of this disclosure are applicable to image forming apparatuses in which the recording sheet P passes through the transfer position upward, downward, obliquely upward, or obliquely downward.

Although the descriptions above concerns the transfer device 40 of the color image forming apparatus employing the secondary transfer belt, aspects of this disclosure are applicable to belt devices of other types, such as a transfer device of direct transfer type used in a monochrome image forming apparatus. Specifically, in the transfer device of direct transfer type, the transfer position is located between an image bearer and a belt disposed in contact with the image bearer, and a toner image is transferred directly from the image bearer onto a recording medium conveyed to the transfer position. Alternatively, aspects of this disclosure are applicable to the intermediate transfer unit 30 including the intermediate transfer belt 31 to contact the photoconductors 2 (the image bearers) to form the transfer nips (the primary transfer nips N1).

In the above-described embodiments, since the transfer device 40 is located below the intermediate transfer belt 31, the pressing frame 49 (the secondary transfer unit 41) is biased by the coil springs 51A and 51B in the upward direction indicated by arrow C (the predetermined direction), toward the secondary transfer nip N2. However, the predetermined direction is not limited thereto. For example, in an arrangement in which the transfer device 40 is disposed on a lateral side of the intermediate transfer belt 31, the predetermined direction is a lateral direction (to right or left) toward the secondary transfer nip N2. For example, in an arrangement in which the transfer device 40 is at a position higher than the intermediate transfer belt 31, the predetermined direction is a downward direction toward the secondary transfer nip N2. In other words, the predetermined direction is a direction in which the pressing frame 49 (the secondary transfer unit 41) is biased toward the secondary transfer nip N2 or the intermediate transfer belt 31.

Although the descriptions are given above regarding changes in the speed of deviation of the belt in the configuration employing the belt guide 502 (e.g., an adjustment plate) as deviation restraint, the speed of deviation of the belt can change in a configuration without the guide as deviation restraint. Accordingly, application of aspects of this disclosure is not limited to the configuration employing the belt guide 502.

For example, aspects of this disclosure are applicable to the following transfer devices and the image forming apparatuses.

1) A transfer device and an image forming apparatus including a flange to which an end face of a belt is pressed to restrict the deviation of the belt. In this configuration, if the speed of deviation of the belt is too fast, the force to draw the belt to one side is strong, and the belt may be damaged.

2) A transfer device and an image forming apparatus including, for example, an optical sensor to detect deviation of a belt and configured to tilt a roller supporting the belt based on the result of detection by the optical sensor, to adjust the deviation of the belt (so-called steering control). In this configuration, if the speed of deviation of the belt is too fast, the sensor may fail to timely detect the deviation, and tilting of the roller may be insufficient to eliminate the deviation of the belt.

3) A transfer device and an image forming apparatus including a flange to contact an end of a belt and move in the width direction of the belt in accordance with the deviation of the belt in the width direction. In conjunction with the movement of the flange, a roller supporting the belt is tilted, to adjust the deviation of the belt. In this configuration, if the speed of deviation of the belt is too fast, the force to draw the belt to one side is strong, and the belt may be damaged. Additionally, tilting of the roller may be insufficient to eliminate the deviation of the belt.

When the aspects of this disclosure are applied to the configurations 1) to 3) described above, the running of the belt can be stabilized in the transfer devices and the image forming apparatuses. Further, the inconveniences of the configurations 1) to 3) described above can be solved.

Although most preferable advantages are described above, advantages of the present disclosure are not limited to the advantages described above.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

For example, image forming apparatuses to which aspects of the present disclosure are applicable are not limited to printers but can be copier, facsimile machines, and multifunction peripherals (MFPs) having at least two of scanning, printing, copying, and facsimile transmission capabilities.

What is claimed is:

1. A belt device comprising:

a belt unit including:

a plurality of rotators; and a belt looped around the plurality of rotators;

a frame including a plurality of support portions to support the belt unit;

a biasing member to bias the belt unit supported by the frame in a predetermined direction; and an adjuster to adjust a position of at least one of the plurality of support portions.

2. The belt device according to claim 1, wherein the plurality of support portions includes a main reference and a sub-reference, and wherein the adjuster is disposed at the sub-reference and on a front side of the belt device.

3. An image forming apparatus comprising:

an image bearer to bear a toner image; and the belt device according to claim 1, wherein the belt is a transfer belt pressed against the image bearer, and wherein the toner image is transferred from the image bearer onto the belt in a transfer nip between the image bearer and the belt.

4. The image forming apparatus according to claim 3, wherein the image bearer is an intermediate transferor, and wherein the belt is a secondary transfer belt.

5. The image forming apparatus according to claim 3, further comprising a sensor to detect the toner image; and a bracket on which the sensor is mounted, wherein a position of the bracket is determined with respect to the belt unit.

6. The image forming apparatus according to claim 5, wherein the sensor is opposed to one of the plurality of rotators via the belt, and wherein the position of the bracket is determined with respect to a shaft of the one of the plurality of rotators.

7. The image forming apparatus according to claim 5, further comprising a bracket support to support the bracket, wherein the adjuster is to adjust a position of the at least one of the plurality of support portions and a position of the bracket support.

8. The image forming apparatus according to claim 7, wherein the bracket support is a support shaft, and wherein the bracket is pivotable on the support shaft.

9. The image forming apparatus according to claim 8, wherein the support shaft is attached to the frame supporting the belt unit.

10. The image forming apparatus according to claim 8, further comprising a frame shaft disposed at a position of the image forming apparatus different from the support shaft being the bracket support, wherein the frame is pivotable on the frame shaft.

11. The image forming apparatus according to claim 7, wherein the bracket support is a support shaft, and wherein the frame and the bracket are pivotable on the support shaft.

12. A belt device comprising:

a belt unit including:

a plurality of rotators; and a belt looped around the plurality of rotators;

a frame including a plurality of support portions to support the belt unit;

a biasing member to bias the belt unit supported by the frame in a predetermined direction; and an adjuster to adjust a twist of the belt unit relative to the frame.

13. An image forming apparatus comprising:

an image bearer to bear a toner image; and the belt device according to claim 12, wherein the belt is a transfer belt pressed against the image bearer, and the toner image is transferred from the image bearer onto the belt in a transfer nip between the image bearer and the belt.

14. The image forming apparatus according to claim 13, further comprising a sensor to detect the toner image; and a bracket on which the sensor is mounted, wherein a position of the bracket is determined with respect to the belt unit.

15. The image forming apparatus according to claim 14, wherein the sensor is opposed to one of the plurality of rotators via the belt, and wherein the position of the bracket is determined with respect to a shaft of the one of the plurality of rotators.

16. The image forming apparatus according to claim 14, further comprising a bracket support to support the bracket, wherein the adjuster is to adjust a position of at least one of the plurality of support portions and a position of the bracket support.

17. The image forming apparatus according to claim 16, wherein the bracket support is a support shaft, and wherein the bracket is pivotable on the support shaft.

18. The image forming apparatus according to claim 17, wherein the support shaft is attached to the frame supporting the belt unit.

19. The image forming apparatus according to claim 17, further comprising a frame shaft disposed at a position of the image forming apparatus different from the support shaft, the frame shaft to support the frame pivotably on the frame shaft.

20. The image forming apparatus according to claim 16, wherein the bracket support is a support shaft, and wherein the frame and the bracket are pivotable on the support shaft.

* * * * *